(12) United States Patent
Cohen et al.

(10) Patent No.: US 7,288,178 B2
(45) Date of Patent: Oct. 30, 2007

(54) METHODS OF AND APPARATUS FOR MAKING HIGH ASPECT RATIO MICROELECTROMECHANICAL STRUCTURES

(75) Inventors: Adam L. Cohen, Los Angeles, CA (US); Gang Zhang, Monterey Park, CA (US); Qui T. Le, Anaheim, CA (US); Michael S. Lockard, Lake Elizabeth, CA (US); Dennis R. Smalley, Newhall, CA (US)

(73) Assignee: Microfabrica, Inc., Van Nuys, CA (US)

( * ) Notice: Subject to any disclaimer, the term of this patent is extended or adjusted under 35 U.S.C. 154(b) by 431 days.

(21) Appl. No.: 10/271,574

(22) Filed: Oct. 15, 2002

(65) Prior Publication Data

US 2003/0127336 A1    Jul. 10, 2003

Related U.S. Application Data

(60) Provisional application No. 60/329,654, filed on Oct. 15, 2001.

(51) Int. Cl.
 *C25D 5/00*   (2006.01)
 *C25D 5/02*   (2006.01)
(52) U.S. Cl. ................. 205/118; 205/135; 205/137
(58) Field of Classification Search ........... 205/118, 205/135, 137
 See application file for complete search history.

(56) References Cited

U.S. PATENT DOCUMENTS 3,823,352 A * 7/1974 Pruniaux et al. ............ 257/331
5,190,637 A * 3/1993 Guckel ....................... 205/118
5,395,508 A * 3/1995 Jolly et al. .................. 205/129
6,027,630 A * 2/2000 Cohen ........................ 205/135
6,179,978 B1 * 1/2001 Hirsh et al. ................. 204/281
6,228,242 B1 * 5/2001 Lavelaine et al. .......... 205/143
2002/0020628 A1 * 2/2002 Basol ......................... 205/102

FOREIGN PATENT DOCUMENTS

WO    WO 98/45504 A1    10/1998

OTHER PUBLICATIONS

Cohen et al., "EFAB: Rapid, low-cost desktop micromachining of high aspect ratio true 3-D MEMS," 12th IEEE International Conference on Microelectromechanical Systems, p. 244-251 (Jan. 17-21, 1999).*

* cited by examiner

*Primary Examiner*—Edna Wong
(74) *Attorney, Agent, or Firm*—Dennis R. Smalley

(57) ABSTRACT

Various embodiments of the invention provide techniques for forming structures (e.g. HARMS-type structures) via an electrochemical extrusion process. Preferred embodiments perform the extrusion processes via depositions through anodeless conformable contact masks that are initially pressed against substrates that are then progressively pulled away or separated as the depositions thicken. A pattern of deposition may vary over the course of deposition by including more complex relative motion between the mask and the substrate elements. Such complex motion may include rotational components or translational motions having components that are not parallel to an axis of separation. More complex structures may be formed by combining the electrochemical extrusion process with the selective deposition, blanket deposition, planarization, etching, and multi-layer operations of a multi-layer electrochemical fabrication process.

20 Claims, 25 Drawing Sheets

METHODS OF AND APPARATUS FOR MAKING HIGH ASPECT RATIO MICROELECTROMECHANICAL STRUCTURES

RELATED CASES

This application claims priority to U.S. Provisional Patent Application No. 60/329,654 which was filed on Oct. 15, 2001 and which is incorporated herein by reference as if set forth in full.

FIELD OF THE INVENTION

The present invention relates generally to the field of Electrochemical Fabrication and the associated formation of three-dimensional structures (e.g. micro-scale or meso-scale structures). In particular, it relates to methods and apparatus for forming such three-dimensional structures using electrochemical deposition techniques, and even more particularly relates to the electrochemical extrusion of such structures via the relative movement of a mask and a substrate.

BACKGROUND OF THE INVENTION

A technique for forming three-dimensional structures (e.g. parts, components, devices, and the like) from a plurality of adhered layers was invented by Adam L. Cohen and is known as Electrochemical Fabrication. It is being commercially pursued by Microfabrica Inc. of Burbank, Calif. under the tradename EFAB™. This technique was described in U.S. Pat. No. 6,027,630, issued on Feb. 22, 2000. This electrochemical deposition technique allows the selective deposition of a material using a unique masking technique that involves the use of a mask that includes patterned conformable material on a support structure that is independent of the substrate onto which plating will occur. When desiring to perform an electrodeposition using the mask, the conformable portion of the mask is brought into contact with a substrate while in the presence of a plating solution such that the contact of the conformable portion of the mask to the substrate inhibits deposition at selected locations. For convenience, these masks might be generically called conformable contact masks; the masking technique may be generically called a conformable contact mask plating process. More specifically, in the terminology of Microfabrica Inc. such masks have come to be known as INSTANT MASKS™ and the process known as INSTANT MASKING™ or INSTANT MASK™ plating. Selective depositions using conformable contact mask plating may be used to form single layers of material or may be used to form multi-layer structures. The teachings of the '630 patent are hereby incorporated herein by reference as if set forth in full herein. Since the filing of the patent application that led to the above noted patent, various papers about conformable contact mask plating (i.e. INSTANT MASKING) and electrochemical fabrication have been published:

1. A. Cohen, G. Zhang, F. Tseng, F. Mansfeld, U. Frodis and P. Will, "EFAB: Batch production of functional, fully-dense metal parts with micro-scale features", Proc. 9th Solid Freeform Fabrication, The University of Texas at Austin, p161, Aug. 1998.
2. A. Cohen, G. Zhang, F. Tseng, F. Mansfeld, U. Frodis and P. Will, "EFAB: Rapid, Low-Cost Desktop Micromachining of High Aspect Ratio True 3-D MEMS", Proc. 12th IEEE Micro Electro Mechanical Systems Workshop, IEEE, p244, January 1999.
3. A. Cohen, "3-D Micromachining by Electrochemical Fabrication", Micromachine Devices, March 1999.
4. G. Zhang, A. Cohen, U. Frodis, F. Tseng, F. Mansfeld, and P. Will, "EFAB: Rapid Desktop Manufacturing of True 3-D Microstructures", Proc. 2nd International Conference on Integrated MicroNanotechnology for Space Applications, The Aerospace Co., April 1999.
5. F. Tseng, U. Frodis, G. Zhang, A. Cohen, F. Mansfeld, and P. Will, "EFAB: High Aspect Ratio, Arbitrary 3-D Metal Microstructures using a Low-Cost Automated Batch Process", 3rd International Workshop on High Aspect Ratio MicroStructure Technology (HARMST'99), June 1999.
6. A. Cohen, U. Frodis, F. Tseng, G. Zhang, F. Mansfeld, and P. Will, "EFAB: Low-Cost, Automated Electrochemical Batch Fabrication of Arbitrary 3-D Microstructures", Micromachining and Microfabrication Process Technology, SPIE 1999 Symposium on Micromachining and Microfabrication, September 1999.
7. F. Tseng, G. Zhang, U. Frodis, A. Cohen, F. Mansfeld, and P. Will, "EFAB: High Aspect Ratio, Arbitrary 3-D Metal Microstructures using a Low-Cost Automated Batch Process", MEMS Symposium, ASME 1999 International Mechanical Engineering Congress and Exposition, November, 1999.
8. A. Cohen, "Electrochemical Fabrication (EFAB™)", Chapter 19 of The MEMS Handbook, edited by Mohamed Gad-EI-Hak, CRC Press, 2002.
9. "Microfabrication-Rapid Prototyping's Killer Application", pages 1-5 of the Rapid Prototyping Report, CAD/CAM Publishing, Inc., June 1999.

The disclosures of these nine publications are hereby incorporated herein by reference as if set forth in full herein.

The electrochemical deposition process may be carried out in a number of different ways as set forth in the above patent and publications. In one form, this process involves the execution of three separate operations during the formation of each layer of the structure that is to be formed:

1. Selectively depositing at least one material by electrodeposition upon one or more desired regions of a substrate.
2. Then, blanket depositing at least one additional material by electrodeposition so that the additional deposit covers both the regions that were previously selectively deposited onto, and the regions of the substrate that did not receive any previously applied selective depositions.
3. Finally, planarizing the materials deposited during the first and second operations to produce a smoothed surface of a first layer of desired thickness having at least one region containing the at least one material and at least one region containing at least the one additional material.

After formation of the first layer, one or more additional layers may be formed adjacent to the immediately preceding layer and adhered to the smoothed surface of that preceding layer. These additional layers are formed by repeating the first through third operations one or more times wherein the formation of each subsequent layer treats the previously formed layers and the initial substrate as a new and thickening substrate.

Once the formation of all layers has been completed, at least a portion of at least one of the materials deposited is generally removed by an etching process to expose or release the three-dimensional structure that was intended to be formed.

The preferred method of performing the selective electrodeposition involved in the first operation is by conformable contact mask plating. In this type of plating, one or more conformable contact (CC) masks are first formed. The CC masks include a support structure onto which a patterned conformable dielectric material is adhered or formed. The conformable material for each mask is shaped in accordance with a particular cross-section of material to be plated. At least one CC mask is needed for each unique cross-sectional pattern that is to be plated.

The support for a CC mask is typically a plate-like structure formed of a metal that is to be selectively electroplated and from which material to be plated will be dissolved. In this typical approach, the support will act as an anode in an electroplating process. In an alternative approach, the support may instead be a porous or otherwise perforated material through which deposition material will pass during an electroplating operation on its way from a distal anode to a deposition surface. In either approach, it is possible for CC masks to share a common support, i.e. the patterns of conformable dielectric material for plating multiple layers of material may be located in different areas of a single support structure. When a single support structure contains multiple plating patterns, the entire structure is referred to as the CC mask while the individual plating masks may be referred to as "submasks". In the present application such a distinction will be made only when relevant to a specific point being made.

In preparation for performing the selective deposition of the first operation, the conformable portion of the CC mask is placed in registration with and pressed against a selected portion of the substrate (or onto a previously formed layer or onto a previously deposited portion of a layer) on which deposition is to occur. The pressing together of the CC mask and substrate occur in such a way that all openings, in the conformable portions of the CC mask contain plating solution. The conformable material of the CC mask that contacts the substrate acts as a barrier to electrodeposition while the openings in the CC mask that are filled with electroplating solution act as pathways for transferring material from an anode (e.g. the CC mask support) to the non-contacted portions of the substrate (which act as a cathode during the plating operation) when an appropriate potential and/or current are supplied.

An example of a CC mask and CC mask plating are shown in FIGS. 1A-1C. FIG. 1A shows a side view of a CC mask 8 consisting of a conformable or deformable (e.g. elastomeric) insulator 10 patterned on an anode 12. The anode has two functions. One is as a supporting material for the patterned insulator 10 to maintain its integrity and alignment since the pattern may be topologically complex (e.g., involving isolated "islands" of insulator material). The other function is as an anode for the electroplating operation. FIG. 1A also depicts a substrate 6 separated from mask 8. CC mask plating selectively deposits material 22 onto a substrate 6 by simply pressing the insulator against the substrate then electrodepositing material through apertures 26a and 26b in the insulator as shown in FIG. 1B. After deposition, the CC mask is separated, preferably non-destructively, from the substrate 6 as shown in FIG. 1C. The CC mask plating process is distinct from a "through-mask" plating process in that in a through-mask plating process the separation of the masking material from the substrate would occur destructively. As with through-mask plating, CC mask plating deposits material selectively and simultaneously over the entire layer. The plated region may consist of one or more isolated plating regions where these isolated plating regions may belong to a single structure that is being formed or may belong to multiple structures that are being formed simultaneously. In CC mask plating, as individual masks are not intentionally destroyed in the removal process, they may be usable in multiple plating operations.

Another example of a CC mask and CC mask plating is shown in FIGS. 1D-1G. FIG. 1D shows an anode 12' separated from a mask 8' that comprises a patterned conformable material 10' and a support structure 20. FIG. 1D also depicts substrate 6 separated from the mask 8'. FIG. 1E illustrates the mask 8' being brought into contact with the substrate 6. FIG. 1F illustrates the deposit 22' that results from conducting a current from the anode 12' to the substrate 6. FIG. 1G illustrates the deposit 22' on substrate 6 after separation from mask 8'. In this example, an appropriate electrolyte is located between the substrate 6 and the anode 12' and a current of ions coming from one or both of the solution and the anode are conducted through the opening in the mask to the substrate where material is deposited. This type of mask may be referred to as an anodeless INSTANT MASK™ (AIM) or as an anodeless conformable contact (ACC) mask.

Unlike through-mask plating, CC mask plating allows CC masks to be formed completely separate from the fabrication of the substrate on which plating is to occur (e.g. separate from a three-dimensional (3D) structure that is being formed). CC masks may be formed in a variety of ways, for example, a photolithographic process may be used. All masks can be generated simultaneously prior to structure fabrication rather than during it. This separation makes possible a simple, low-cost, automated, self-contained, and internally-clean "desktop factory" that can be installed almost anywhere to fabricate 3D structures, leaving any required clean room processes, such as photolithography to be performed by service bureaus or the like.

An example of the electrochemical fabrication process discussed above is illustrated in FIGS. 2A-2F. These figures show that the process involves deposition of a first material 2 which is a sacrificial material and a second material 4 which is a structural material. The CC mask 8, in this example, includes a patterned conformable material (e.g. an elastomeric dielectric material) 10 and a support 12 which is made from deposition material 2. The conformal portion of the CC mask is pressed against substrate 6 with a plating solution 14 located within the openings 16 in the conformable material 10. An electric current, from power supply 18, is then passed through the plating solution 14 via (a) support 12 which doubles as an anode and (b) substrate 6 which doubles as a cathode. FIG. 2A, illustrates that the passing of current causes material 2 within the plating solution and material 2 from the anode 12 to be selectively transferred to and plated on the substrate 6. After electroplating the first deposition material 2 onto the substrate 6 using CC mask 8, the CC mask 8 is removed as shown in FIG. 2B. FIG. 2C depicts the second deposition material 4 as having been blanket-deposited (i.e. non-selectively deposited) over the previously deposited first deposition material 2 as well as over the other portions of the substrate 6. The blanket deposition occurs by electroplating from an anode (not shown), composed of the second material, through an appropriate plating solution (not shown), and to the cathode/substrate 6. The entire two-material layer is then planarized to achieve precise thickness and flatness as shown in FIG. 2D. After repetition of this process for all layers, the multi-layer structure 20 formed of the second material 4 (i.e. structural material) is embedded in first material 2 (i.e. sacrificial material) as shown in FIG. 2E. The embedded structure is etched to yield the desired device, i.e. structure 20, as shown in FIG. 2F.

Various components of an exemplary manual electrochemical fabrication system 32 are shown in FIGS. 3A-3C. The system 32 consists of several subsystems 34, 36, 38, and 40. The substrate holding subsystem 34 is depicted in the upper portions of each of FIGS. 3A to 3C and includes several components: (1) a carrier 48, (2) a metal substrate 6 onto which the layers are deposited, and (3) a linear slide 42 capable of moving the substrate 6 up and down relative to the carrier 48 in response to drive force from actuator 44. Subsystem 34 also includes an indicator 46 for measuring differences in vertical position of the substrate which may be used in setting or determining layer thicknesses and/or deposition thicknesses. The subsystem 34 further includes feet 68 for carrier 48 which can be precisely mounted on subsystem 36.

The CC mask subsystem 36 shown in the lower portion of FIG. 3A includes several components: (1) a CC mask 8 that is actually made up of a number of CC masks (i.e. submasks) that share a common support/anode 12, (2) precision X-stage 54, (3) precision Y-stage 56, (4) frame 72 on which the feet 68 of subsystem 34 can mount, and (5) a tank 58 for containing the electrolyte 16. Subsystems 34 and 36 also include appropriate electrical connections (not shown) for connecting to an appropriate power source for driving the CC masking process.

The blanket deposition subsystem 38 is shown in the lower portion of FIG. 3B and includes several components: (1) an anode 62, (2) an electrolyte tank 64 for holding plating solution 66, and (3) frame 74 on which the feet 68 of subsystem 34 may sit. Subsystem 38 also includes appropriate electrical connections (not shown) for connecting the anode to an appropriate power supply (not shown) for driving the blanket deposition process.

The planarization subsystem 40 is shown in the lower portion of FIG. 3C and includes a lapping plate 52 and associated motion and control systems (not shown) for planarizing the depositions.

In the last decade or so, there has been interest in creating MEMS devices whose overall height is comparable to or greater than their lateral extents; such structures are called high aspect ratio microstructures, or "HARMS". Two processes have emerged to dominate the manufacture of HARMS. They are LIGA and deep reactive ion etching (DRIE). LIGA is used to form metal structures and via secondary molding operations it may be used to produce polymer and ceramics structures. DRIE is used for etching deep holes into silicon.

The LIGA process is illustrated in FIGS. 4A-4G. The process is essentially based on "through-mask plating" using a very thick patterned resist (e.g., 100s of microns to a centimeter or more). The resist is patterned using extremely high energy X-rays (e.g., >1 GeV) which allows the radiation to penetrate through the thick resist without significant attenuation or scattering. This, combined with a highly-collimated synchrotron beam, makes possible the fabrication of structures with very straight and parallel sidewalls having very smooth surfaces.

In FIG. 4A a substrate 81 is prepared (e.g., by planarizing, cleaning, and depositing a conductive plating base (not shown). In FIG. 4B a thick layer of polymer 82 serving as an X-ray resist (typically poly(methylmethacrylate), or PMMA), is bonded to the plating base. As shown in FIG. 4C the resist 82 is exposed to energetic X-rays 83 through a specially-fabricated patterned mask 84 that may for example include gold patterning 85 on a silicon or graphite base 86. The exposure renders certain areas of the resist soluble in a developing chemical. FIG. 4D shows the patterned resist after development yielding mask 87, which has openings that extend to the plating base on the substrate 81. Next a through-mask selective electroplating operation occurs. FIG. 4E shows the substrate 81 with mask 87 immersed in a deposition bath 88 held in a deposition tank 89, an anode 91; electrical connections 92 and 93 connecting the anode and substrate to a power supply 94. When current is applied, a metal 99' (or other electrodepositable material) is deposited onto the exposed plating base of substrate 81. If a low-stress formulation and deposition parameters are employed, the deposition can be continued to yield a thick deposit of metal (or other material) 99 as shown in FIG. 4F. Then, as is shown in FIG. 4G, the mask 87 can be removed (usually chemically) to yield the released deposited structure 100 comprising metal 99. If desired, this microstructure 100 can then be used for molding other materials such as polymers or ceramics, for example, using injection molding or embossing techniques, for mass production.

Materials typically electrodeposited in LIGA are pure metals such as Ni, Cu, and Au, or metal alloys such as Ni—Fe (e.g., Permalloy). The latter is challenging due to limited mass transfer in the high aspect ratio mask. Also composite materials such as Ni and SiC can be deposited.

Because of the high cost of LIGA and an associated shortage of infrastructure, efforts have been made recently to develop alternative methods of fabricating through-mask electrodeposition masks with reasonably high aspect ratios (though much lower than those attainable with LIGA). One such effort is "UV-LIGA", in which a UV-curable resist is used (e.g., a negative-working photoresist called SU-8, which is an epoxy based photopolymer, has been available commercially for several years). Though SU-8 can achieve reasonably vertical sidewalls and thicknesses up to several hundred microns, it is extremely difficult to remove after the electrodeposition process is completed.

Another method that has been explored is sometimes known as Laser LIGA: it involves the use of a laser (typically a UV excimer laser) to machine cavities in a polymer to form a mask. This technique can create masks up to several tens of microns thick, but the sidewalls tend to be tapered (i.e., not parallel) and somewhat rough.

A need exists for a more cost effective HARMS technology. A need exists for a HARMS technology that is compatible with the formation of HARMS devices on substrates containing microelectronic devices (e.g., a CMOS wafer). A need exists for a HARMS technology that results in structures having more uniform properties throughout their heights. This is particularly true when deposition of alloying materials is to occur (inhibition of ionic transport into deep through-masks can vary by ionic specifies and by depth level in the mask). A need exists for a HARMS technology that allows formation of more complex structures.

SUMMARY OF THE INVENTION

It is an object of various aspects of the present invention, or of variations thereof, to provide a more cost effective HARMS-type technology.

It is an object of various aspects of the present invention, or of variations thereof, to provide a HARMS-type technology that is compatible with the formation of HARMS devices on substrates containing microelectronic devices.

It is an object of various aspects of the present invention, or of variations thereof, to provide a HARMS-type technology that results in structures having more uniform properties throughout their heights.

It is an object of various aspects of the present invention, or of variations thereof, to provide a HARMS-type technology that allows formation of more complex structures.

It is an object of various aspects of the present invention, or of variations thereof, to provide enhanced electrochemical fabrication techniques that can be used to supplement the formation capabilities associated with CC mask plating.

It is an object of various aspects of the present invention, or of variations thereof, to provide enhanced electrochemical formation capabilities It is an object of various aspects of the present invention, or of variations thereof, to expand the range of materials that can be used in HARMS-type applications.

Other objects and advantages of various aspects of the invention will be apparent to those of skill in the art upon review of the teachings herein. The various aspects of the invention, set forth explicitly herein or otherwise ascertained from the teaching herein, may address any one of the above objects alone or in combination, or alternatively may address some other object of the invention ascertained from the teachings herein. It is not intended that all of these objects be addressed by any single aspect of the invention even though that may be the case with regard to some aspects.

In the 1st through 6th aspects of the invention, a method of producing a three-dimensional structure, includes: providing an electrode that functions as an anode; providing a substrate that functions as a cathode; providing an electrolyte between the anode and the substrate; providing a current source controllably connected to the anode and substrate; providing a mask that includes an at least partially conformable material, the mask having at least one opening extending through the conformable material wherein the opening is defined by mask sidewalls and wherein the opening defines a mask pattern, the conformable portion of the mask also having a face surface; pressing the face surface of the mask against the substrate; after pressing, activating the current source to cause deposition of a first material onto the substrate in a deposition pattern that is at least in part dictated by the pattern of the mask, wherein the deposition comprises deposition sidewalls; and after said activating, relatively moving the face surface of the mask away from the substrate by a distance that is less than a distance that would cause separation of the mask sidewalls from the deposition sidewalls, and continuing application of the current so as to allow a height of the deposition to increase; and wherein one of the following is included:

(1) deviating a shape of the deposition such that the deposition has tapering sidewalls;

(2) after an initial separating of the mask and the substrate, locating a liquid within a region between the mask and substrate such that any residual electrolyte that remains or leaks between the sidewalls of the mask and the sidewalls of the deposition is diluted or removed such that deposition onto the substrate within the region is substantially eliminated or at least held to a tolerable level;

(3) after an initial separating of the mask and the substrate, depositing a second material onto the substrate and adjacent the deposited first material;

(4) interrupting the application of the current that increases the deposition height; and etching a portion of the first material from the substrate during the interruption and then continuing application of a current that increases the deposition height;

(5) wherein the mask further includes a support structure which is adhered to the conformable material and through which the at least one opening extends; wherein a cross-sectional dimension of at least one opening through at least a portion of the support structure is smaller than a cross-sectional dimension of the opening through the conformable material; and wherein a height of deposition, relative to the support structure, within the at least one opening, is, at least in part, ascertained by detecting a change of an electrical property; or (6) detecting a first electrical parameter whose value depends on a location of a deposit within the opening.

In the $7^{th}$ through $12^{th}$ aspects of the invention, a method of producing a three-dimensional structure, includes: providing a substrate on which deposition of a first material can occur; providing a mask that includes a masking material and at least one opening therein, wherein the masking material has a face surface that can contact the substrate and wherein the masking material surrounding the opening forms mask sidewalls and defines a mask pattern; selectively depositing material onto the substrate while the mask is pressed against the substrate and thereafter relatively separating the mask from the substrate while maintaining contact between the mask sidewalls and the deposited first material and continuing the deposition of the first material so that a height of deposition increases beyond what it was prior to beginning the separation of the mask and the substrate; and wherein one of the following is included:

(7) deviating a shape of the deposition such that the deposition has tapering sidewalls;

(8) after an initial separating of the mask and the substrate, locating a liquid within a region between the mask and substrate such that any residual electrolyte that remains or leaks between the sidewalls of the mask and the sidewalls of the deposition is diluted or removed such that deposition onto the substrate within the region is substantially eliminated or at least held to a tolerable level;

(9) after an initial separating of the mask and the substrate, depositing a second material onto the substrate and adjacent the deposited first material within a region between the mask and the substrate;

(10) interrupting the depositing of the first material onto the substrate; and etching a portion of the first material from the substrate during the interruption; and then continuing selective depositing of the first material to the substrate;

(11) wherein the masking material comprises a conformable material and a support structure through which the at least one opening extends; wherein a cross-sectional dimension of at least one opening through at least a portion of the support structure is smaller than a cross-sectional dimension of the opening through the conformable material; wherein a height of deposition, relative to the support structure, within the at least one opening is at least in part ascertained by detecting a change of an electrical property; or

(12) detecting a first electric parameter whose value depends on a location of a deposit within the opening.

In the $13^{th}$ through $18^{th}$ aspects of the invention, an apparatus for producing a three-dimensional structure, includes: an electrode that can be electrically biased to function as an erodable anode; a substrate on which a deposition material may be deposited and which can be electrically biased as a cathode; a container for holding an electrolyte that can form a conductive path between the electrode and the substrate; a current source controllably connected to the electrode and the substrate; a mask that includes an at least partially conformable material, the mask having at least one opening extending through the conformable material wherein the opening is defined by mask sidewalls and wherein the opening defines a mask pattern, the conformable portion of the mask also having a face surface; means for pressing the face surface of the mask against the substrate; means for activating the current source to cause deposition of a first material onto the substrate in a deposition pattern at least in part dictated by the pattern of the mask, wherein the deposition comprises deposition sidewalls; means for relatively moving the face surface of the mask away from the substrate by a distance that is less than a distance that would cause separation of the mask sidewalls from the deposition sidewalls, and continuing application of the current so as to allow a height of the deposition to increase; and wherein one of the following is included:

(13) means for causing the sidewalls of the deposition to be, at least in part, tapered;

(14) means for locating a liquid within a region between the mask and substrate such that any residual electrolyte that remains or leaks between the sidewalls of the mask and the sidewalls of the deposition is diluted or removed such that deposition onto the substrate within the region is substantially eliminated or at least held to a tolerable level.

(15) means for depositing a second material onto the substrate adjacent the deposited first material and within a region between the mask and the substrate;

(16) means for interrupting the application of the current that increases the deposition height; and means for etching a portion of the first material from the substrate during the interruption and then continuing application of the current that increases the deposition height;

(17) wherein the mask includes a support structure which is adhered to the conformable material and through which the at least one opening extends; wherein a cross-sectional dimension of at least one opening through at least a portion of the support structure is smaller than a cross-sectional dimension of the opening through the conformable material; and a means for detecting a change of an electrical property, wherein a value of the electric property is related to a height of deposition, relative to the support structure, within the at least one opening; or

(18) means for detecting a first electrical parameter whose value depends on a location of a deposit within the opening.

In the $19^{th}$ through $24^{th}$ aspects of the invention, an apparatus for producing a three-dimensional structure, includes: a substrate on which deposition of a first material can occur; a mask having a pattern comprised of a masking material and at least one opening therein, wherein the masking material has a face surface that can contact the substrate and wherein the masking material surrounding the opening forms mask sidewalls; means for selectively depositing material onto the substrate while the mask is pressed against the substrate and thereafter relatively separating the mask from the substrate while maintaining contact between the mask sidewalls and the deposited material and continuing the deposition of material so that a height of deposition increases beyond what it was prior to beginning the separation of the mask and the substrate; and wherein one of the following is included

(19) means for causing the sidewalls of the deposition to be, at least in part, tapered;

(20) means for locating a liquid within a region between the mask and substrate such that any residual electrolyte that remains or leaks between the sidewalls of the mask and the sidewalls of the deposition is diluted or removed such that deposition onto the substrate within the region is substantially eliminated or at least held to a tolerable level.

(21) means for depositing a second material onto the substrate adjacent the first deposited material and within a region between the mask and the substrate;

(22) means for interrupting the depositing of the first material to the substrate; and means for etching a portion of the deposited first material from the substrate during the interruption and then continuing selective depositing of material to the substrate;

(23) wherein the mask includes a support structure which is adhered to the conformable material and through which the at least one opening extends; wherein a cross-sectional dimension of at least one opening through at least a portion of the support structure is smaller than a cross-sectional dimension of the opening through the conformable material; and a means for detecting a change of an electrical property, wherein a value of the electric property is related to a height of deposition, relative to the support structure, within the at least one opening; or

(24) means for detecting a first electrical parameter whose value depends on a location of a deposit within the opening.

In the $25^{th}$ through $30^{th}$ aspects of the invention, a method of producing a three-dimensional structure, includes: providing a substrate from which a pattern protrudes, where the pattern has pattern sidewalls and the substrate has a face surface that is approximately perpendicular to the sidewalls; providing a mask, having a pattern, wherein the mask includes a masking material and at least one opening therein, wherein the masking material has a face surface that is substantially parallel to the face of the substrate and wherein the masking material surrounding the opening forms mask sidewalls; mating the mask sidewalls with the pattern sidewalls without mating the face surface of the masking material with the face surface of the substrate and then depositing a first material through the opening onto the substrate; and wherein one of the following is included:

(25) deviating a shape of the deposition such that the deposition has tapering sidewalls;

(26) after an initial separating of the mask and the substrate, locating a liquid within a region between the mask and substrate such that any residual electrolyte that remains or leaks between the sidewalls of the mask and the sidewalls of the deposition is diluted or removed such that deposition onto the substrate within the region is substantially eliminated or at least held to a tolerable level;

(27) after an initial separating of the mask and the substrate, depositing a second material onto the substrate and adjacent the deposited first material within a region between the mask and the substrate;

(28) interrupting the depositing of the first material onto the substrate; and etching a portion of the first material from the substrate during the interruption; and then continuing selective depositing of the first material to the substrate;

(29) wherein the masking material comprises a conformable material and a support structure through which the at least one opening extends; wherein a cross-sectional dimension of at least one opening through at least a portion of the support structure is smaller than a cross-sectional dimension of the opening through the conformable material; wherein a height of deposition, relative to the support structure, within the at least one opening is at least in part ascertained by detecting a change of an electrical property; or

(30) detecting a first electric parameter whose value depends on a location of a deposit within the opening.

In variations of the $1^{st}$ aspect, the method additionally includes one or more of (1) deviating the shape of the deposition prior to completing the depositing that results in a full height of the deposition; (2) deviating the shape by varying the dimensions of the at least one opening defined by the mask sidewalls; (3) deviating is at least in part accomplished by varying the temperature of at least a portion of the conformable portion of the mask; (4) the deviating of the shape occurs by progressively immersing the deposition into a chemical etchant such that portions immersed for longer periods of time are more deeply etched than portions immersed for shorter periods of time; (5) the deviating of the shape occurs by progressively immersing the deposition into an electrochemically active etchant wherein the deposition is treated as an anode in relation to a separate cathode wherein portions that undergo longer periods of electrochemical etching are etched more deeply than portions that undergo shorter or less intense periods of electrochemical etching; (6) the deviating of the shape occurs at least in part by performing an etching operation; (7) deviating occurs after completing the depositing that results in a height of the deposition reaching a final height. (8) deviating occurs by an etching operation and the etching operation includes immersing at least a portion of the deposition into a chemical etchant; (9) deviating occurs by immersing the deposition in a chemical etchant where the immersion time varies by height along the deposition; (10) deviating occurs by a chemical etching operation followed by a rinsing operation; and/or (11) the tapering provides a deposition that is larger near the substrate and smaller away from the substrate.

In variations of the $2^{nd}$ aspect, the method additionally includes one or more of (1) agitating the liquid within the region, and/or (2) causing the liquid to flow within or through the region.

In variations of the $3^{rd}$, $9^{th}$, and $27^{th}$ aspects, the methods additionally include one or more of (1) the first material and second material being deposited, at least in part, simultaneously or in an alternating manner; (2) the first deposition material including copper and the second deposition material including nickel; and/or (3) copper depositions and nickel depositions are planarized to have similar heights.

In variations of the $24^{th}$, $25^{th}$, and $27^{th}$ aspects, the methods additionally include the deposition of material through the opening being accompanied by simultaneous increasing or non-simultaneous, intermittent increasing of a separation of the face surface of the mask from the face surface of the substrate.

In variations of the $4^{th}$, $10^{th}$, and $28^{th}$ aspects, the methods additionally include: the etching being initiated by applying an anodic potential to the substrate and conducting a current between the substrate and a cathode, and/or (2) the depositing and etching being alternated a plurality of times.

In variations of the $5^{th}$, $11^{th}$, and $29^{th}$ aspects, the methods additionally include: the electric property being a change in voltage between an anode and cathode that are used in the depositing of material.

In variations of the $6^{th}$, $12^{th}$, and $30^{th}$ aspects, the methods additionally include one or more of: (1) detecting a second electrical parameter whose value depends on a location of a deposit within the opening; (2) the first electrical parameter indicating whether or not the deposit extends too deep into the opening and the second electrical parameter indicating whether or not the deposit extends at least a minimum acceptable depth into the opening; (3) the first electrical parameter includes a voltage difference between the substrate and a conductor positioned at a first level of an opening in the mask; (4) the first electrical parameter including a voltage difference between the anode and a conductor positioned at a first level of an opening in the mask; and/or detecting of selected values of the electrical parameter being used to influence movement between the mask and the substrate.

Further aspects of the invention will be understood by those of skill in the art upon reviewing the teachings herein. Other aspects of the invention may involve apparatus that can be used in implementing one or more of the above method aspects of the invention. Other aspects of the invention may provide various combinations of the aspects presented above as well as provide other configurations, structures, functional relationships, and processes that have not been specifically set forth above.

BRIEF DESCRIPTION OF THE DRAWINGS

FIGS. 1A-1C schematically depict a side view of various stages of a CC mask plating process, while

FIGS. 7A-7C depict side views of various stages in a process according to a preferred embodiment of the present invention while

DETAILED DESCRIPTION OF PREFERRED EMBODIMENTS OF THE INVENTION

Figure 1A:
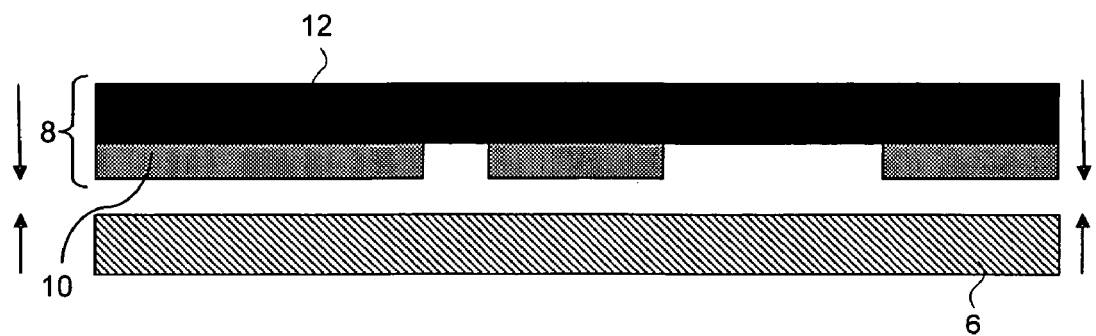
Figure 1B:
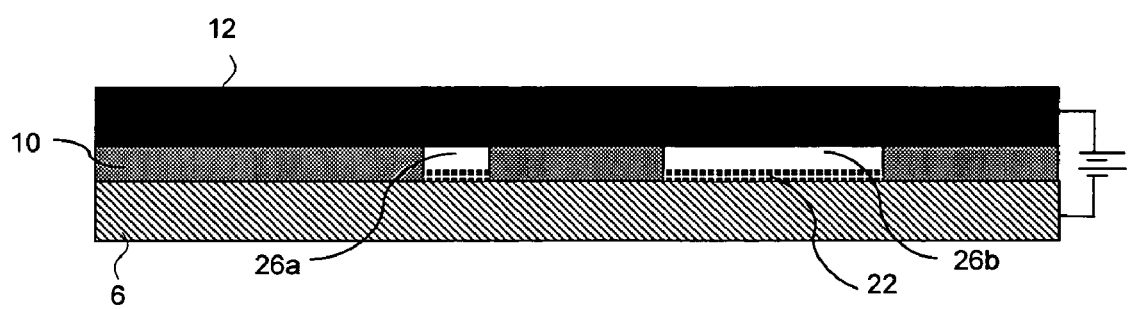
Figure 1C:
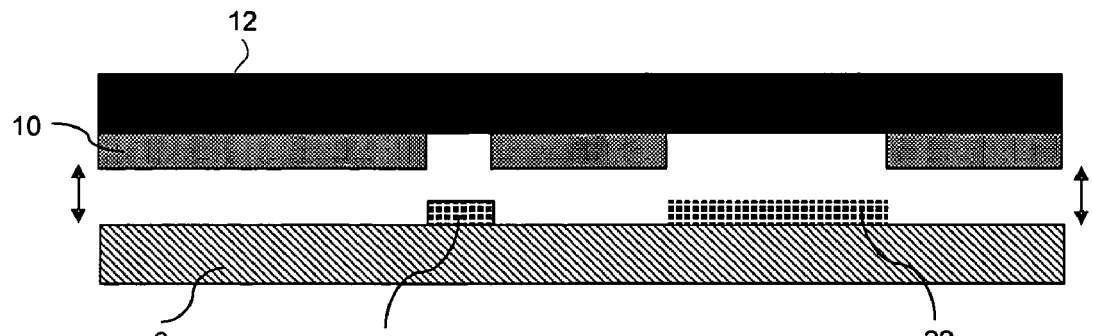
Figure 1D:
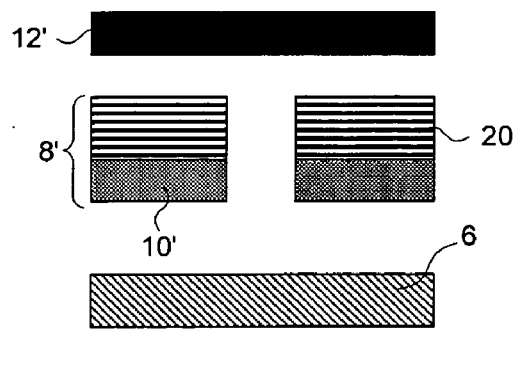
FIGS. 1D-1G depict a side view of various stages of CC mask plating process using a different type of CC mask.
Figure 1E:
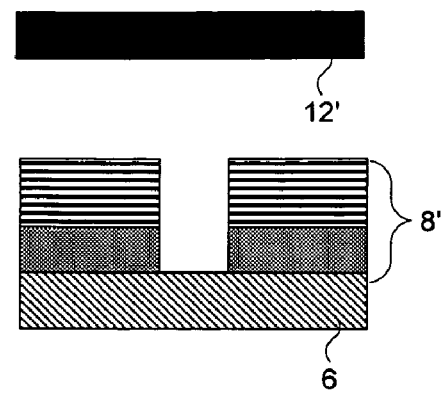
Figure 1F:
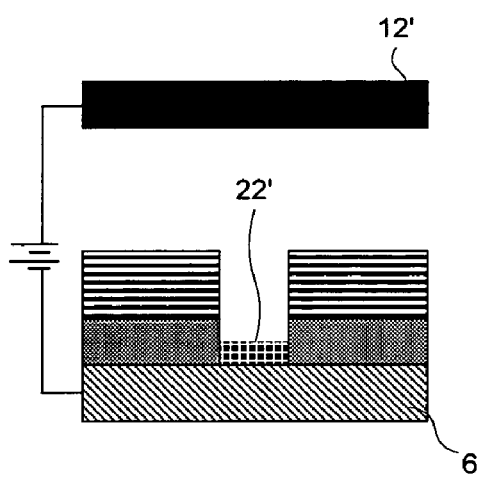
Figure 1G:
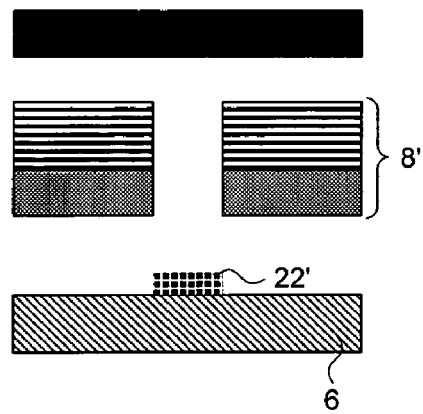
Figure 2A:
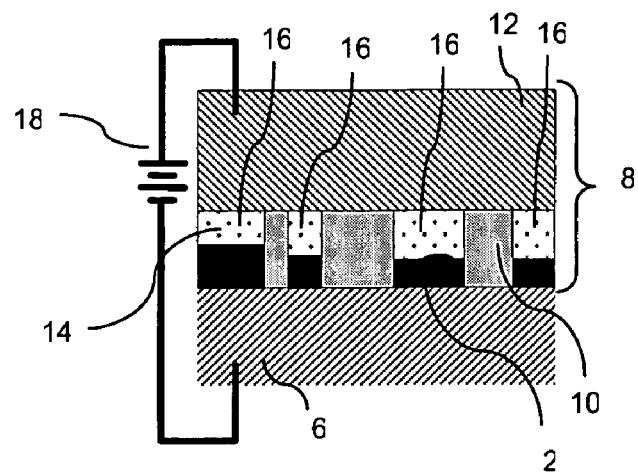
FIGS. 2A-2F schematically depict side views of various stages of an electrochemical fabrication process as applied to the formation of a particular structure where a sacrificial material is selectively deposited while a structural material is blanket deposited.
Figure 2B:
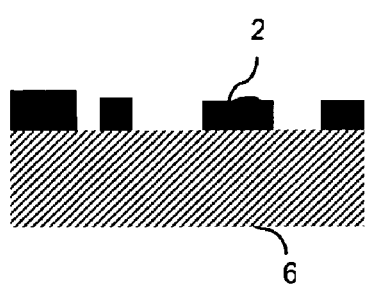
Figure 2C:
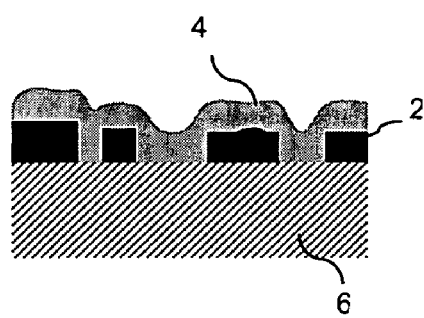
Figure 2D:
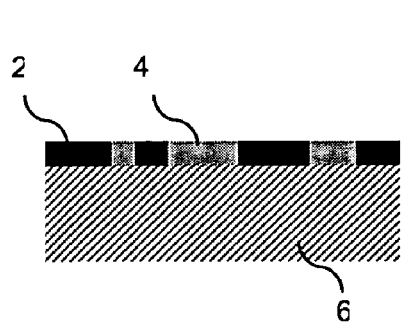
Figure 2E:
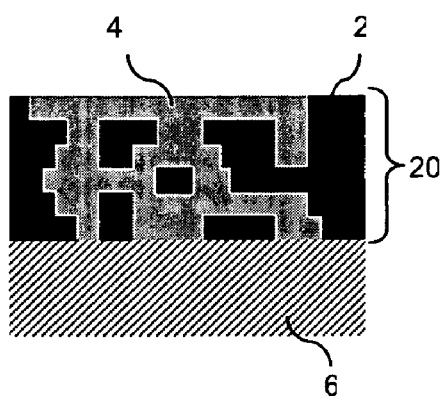
Figure 2F:
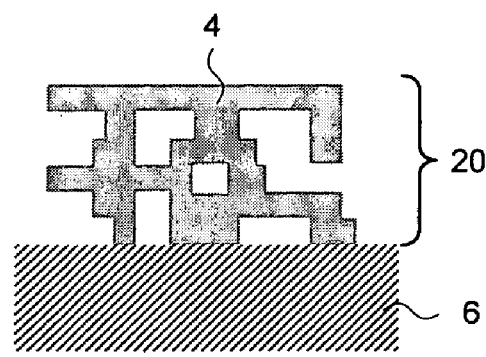
Figure 3A:
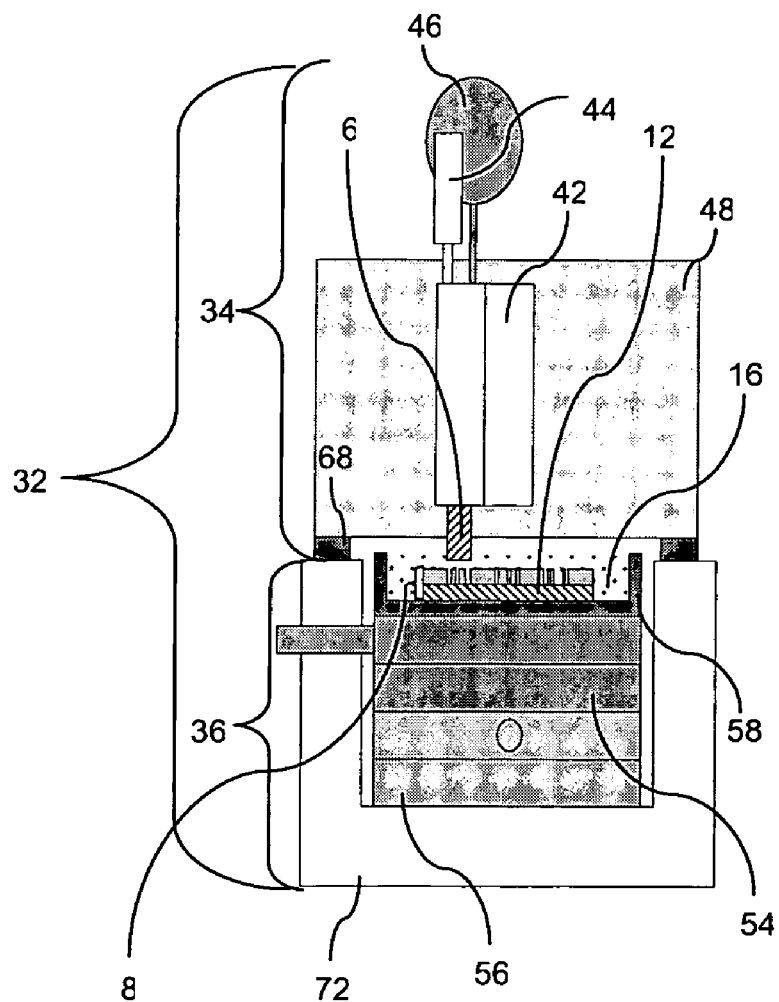
FIGS. 3A-3C schematically depict side views of various example subassemblies that may be used in manually implementing the electrochemical fabrication method depicted in FIGS. 2A-2F.
Figure 3B:
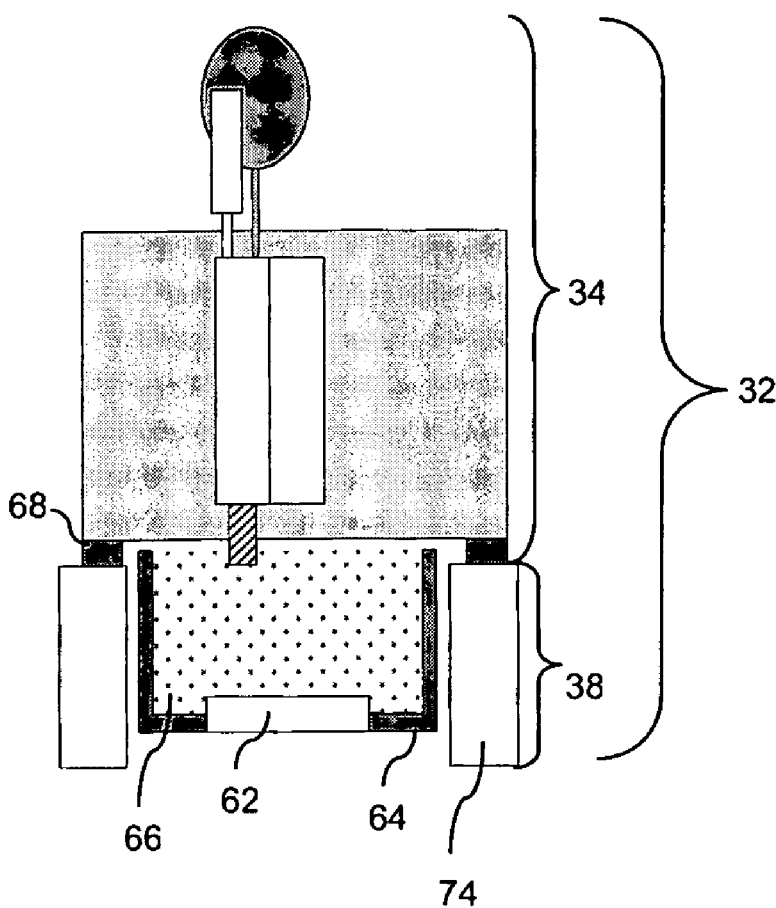
Figure 3C:
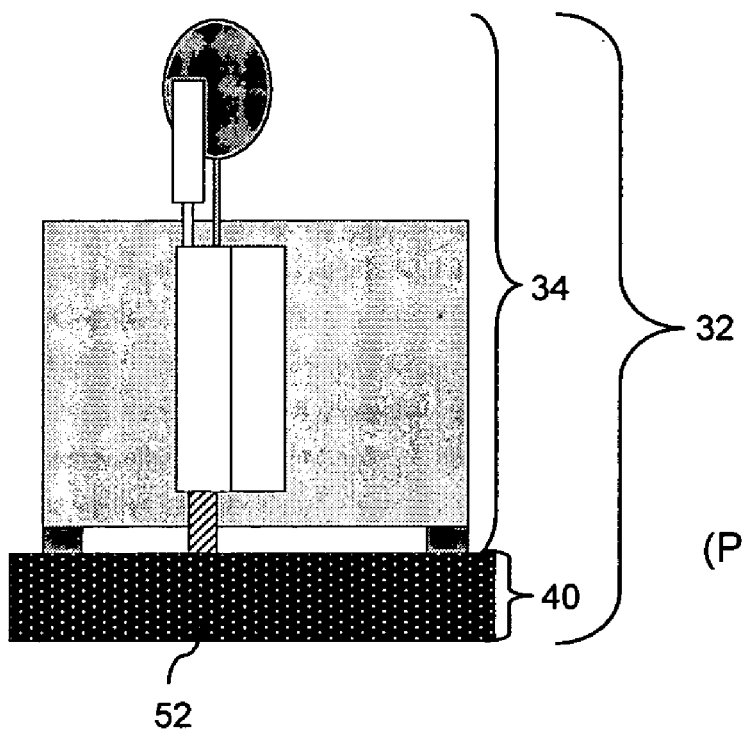
Figure 4A:
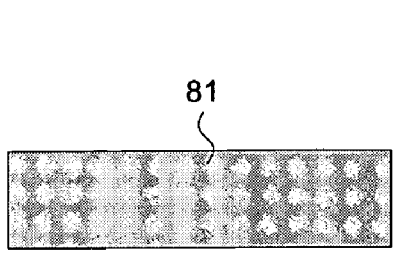
FIGS. 4A-4G depict side views of various stages in a LIGA process for forming a HARMS-type structure.
Figure 4B:
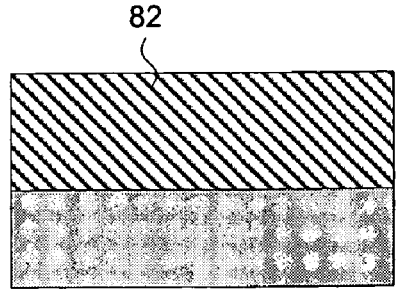
Figure 4C:
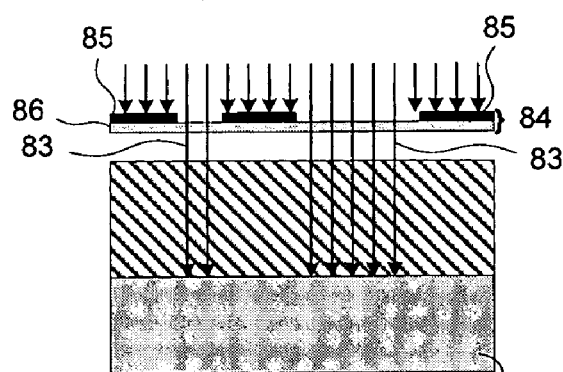
Figure 4D:
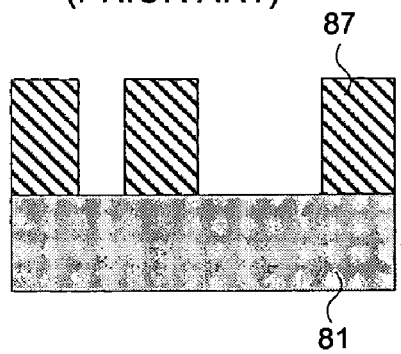
Figure 4E:
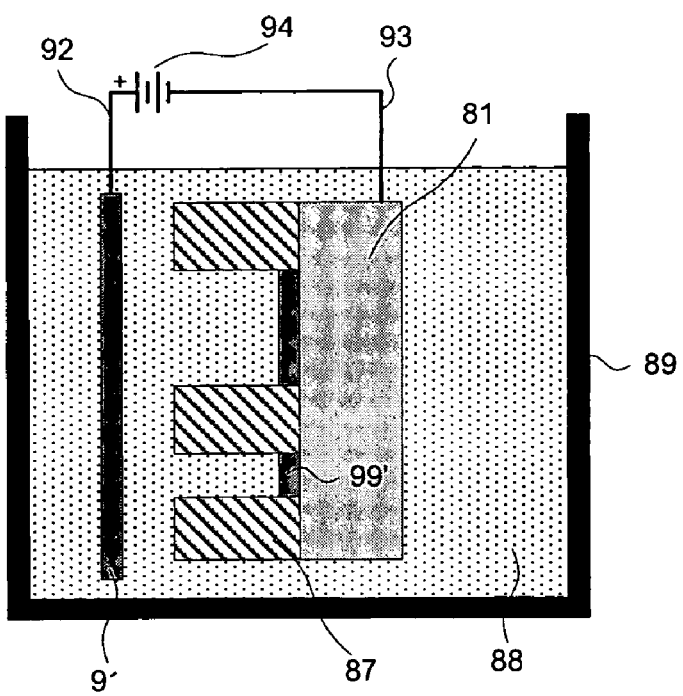
Figure 4F:
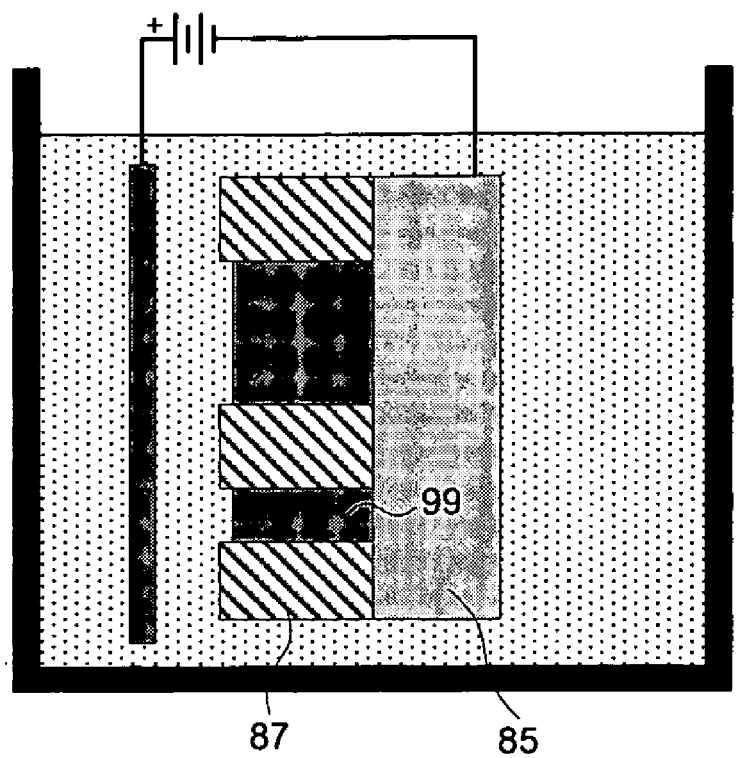
Figure 4G:
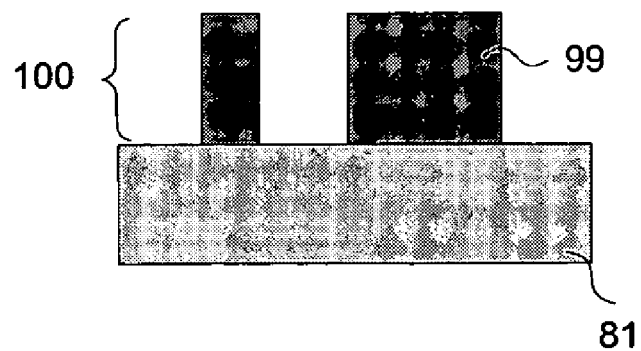

FIGS. 1A-1G, 2A-2F, and 3A-3C illustrate various aspects of electrochemical fabrication that are known. Other electrochemical fabrication techniques are set forth in the '630 patent referenced above, in the various previously incorporated publications, in patent applications incorporated herein by reference, still others may be derived from combinations of various approaches described in these publications, patents, and applications, or are otherwise known or ascertainable by those of skill in the art. All of these techniques may be combined with those of the present invention to yield enhanced embodiments.

Various embodiments of the invention present techniques for forming structures (e.g. HARMS-type structures) via an electrochemical extrusion (ELEX™) process. Some preferred embodiments perform the extrusion process via depositions through an anodeless conformable contact mask that is initially pressed against a substrate and is then progressively pulled away from the substrate as the deposition thickens. The pattern of deposition may vary over the course of deposition by including relative motion between the mask and the substrate that includes translational or rotational components. More complex structures may be formed by combining the extrusion process with the selective deposition, blanket deposition, planarization, etching, and multilayer operations of the electrochemical fabrication processes set forth in the U.S. Pat. No. 6,027,630. In other embodiments, there may be no need for an initial face-to-face contact between the mask and the substrate particularly if the extrusion is to be added to an existing deposition where the contact can begin with a mating of side walls. In still other embodiments the mask may be placed in proximity to the substrate and an initial deposition can be used to seal the mask and he substrate such that the initial gap is at least partially filled with a deposition material.

In a first preferred embodiment, the mask is initially pressed against the substrate so that the face of its conformable material (e.g. elastomeric surface) conforms to the substrate as in CC mask plating illustrated in FIGS. 1A-1G. This contact positioning of the conformable contract mask prevents any deposition of material in contacted regions. An expandable bellows chamber is provided that surrounds the substrate and prevents the deposition bath from contacting the sides or rear of the substrate as well as the sides of later deposits, and thus prevents deposition in those regions. When the deposit has begun to grow in thickness, the substrate (or mask) is withdrawn at a controlled rate that on average closely matches the deposition rate, such that the progressing "working surface" (i.e. the surface at which the deposition is occurring) remains relatively fixed with respect to the mask. During the movement, when the face of the mask no longer contacts the substrate, the sidewalls of the mask remain in intimate contact with the deposit, thus forming a seal which prevents deposition other than in the open areas of the mask. Eventually, a high aspect ratio structure, or at least a structure having a height in excess of that normally allowed by a mask of given dimensions, may be generated which is easily separated from the mask which can then be reused.

A first preferred embodiment is illustrated in FIGS. 5A-5F. This embodiment uses a relatively thin mask (i.e. much thinner than the masks used in LIGA) that is independent of the substrate, and which is moved relative to the substrate during deposition to extrude a structure.

Figure 5A:
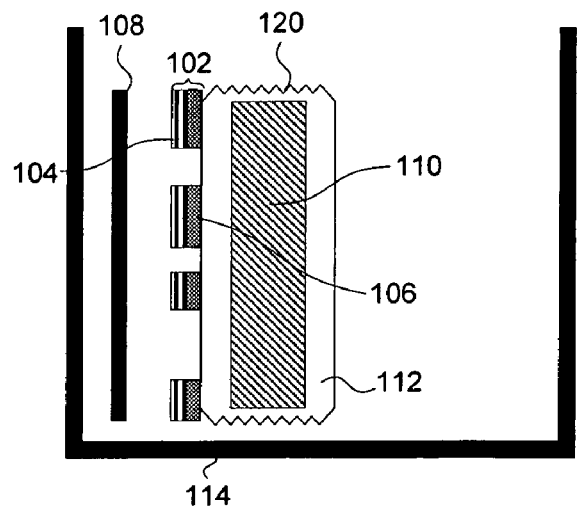
FIGS. 5A-5F depict side views of various stages in a process according to a preferred embodiment of the present invention.
Figure 5B:
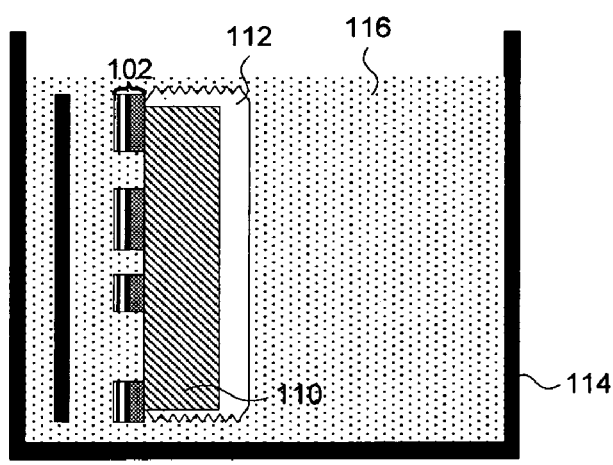
Figure 5C:
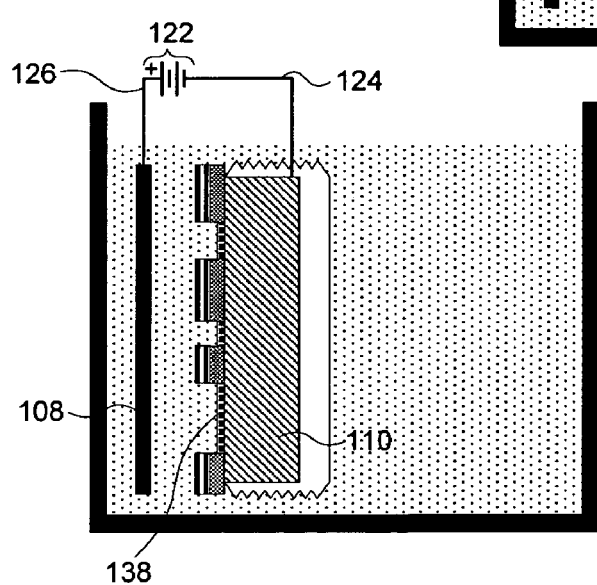

FIGS. 5A-5F illustrate side views of various stages in the process of this embodiment along with the various components that are used in the embodiment. FIG. 5A illustrates a mask 102 that includes a support portion 104 (e.g. a rigid or dimensionally stable structure) and a conformable portion 106, an electrode 108 that may function as an anode, a substrate 110, and a bellows 120 and bellows chamber 112 that are located within a deposition tank 114 that can hold an electrolyte 116 (shown in FIG. 5B). The open side of the bellows 120 connects to and seals with a perimeter region of the mask 102. This sealing makes the openings through the mask the only paths between the inside and outside of the bellows. Next, as shown in FIG. 5B, the substrate 110 and the mask 102 are pressed against each other and the tank 114 is filled with electrolyte 116 in such a manner that the electrolyte does not become located in the region 112 between the substrate and the bellows. As shown in FIG. 5C a potential is applied between the anode 108 and the substrate 110 (which acts as a cathode) via power source 122 and wires 124 and 126. The potential is supplied with a polarity and current that allows a deposition 138 to begin forming on the substrate at an appropriate rate. The primary source of the deposition material is preferably the anode 108 with potentially some deposition material being supplied directly by the electrolyte.

After the deposition thickens to a desired height, the substrate and the mask begin to separate at a desired rate. The average rate of separation is preferably approximately equal to the average rate of deposition such that a deposition zone and a location on the mask surface stay in the same approximate position throughout the deposition operation with the exception of the initial portion of the deposition that occurs before movement begins. During separation, the sidewalls 132 of the mask seal with the sidewalls 134 of the growing deposit 138 such that the electrolyte does not enter the bellows chamber 112. In one embodiment the deposition rate and the movement occur in such a manner that the position of the deposition stays at a position 140 relative to the face surface 136 of the mask resulting in a separation of "L". In other embodiments though the average deposition rate and the separation rate are approximately equal, actual separation may occur in discrete and discontinuous steps while the deposition may occur in a continuous manner, or in a discontinuous manner. Deposition and movement may occur in an alternating manner at different times. In some embodiments the working surface may extend into the support region of the mask.

Figure 5D:
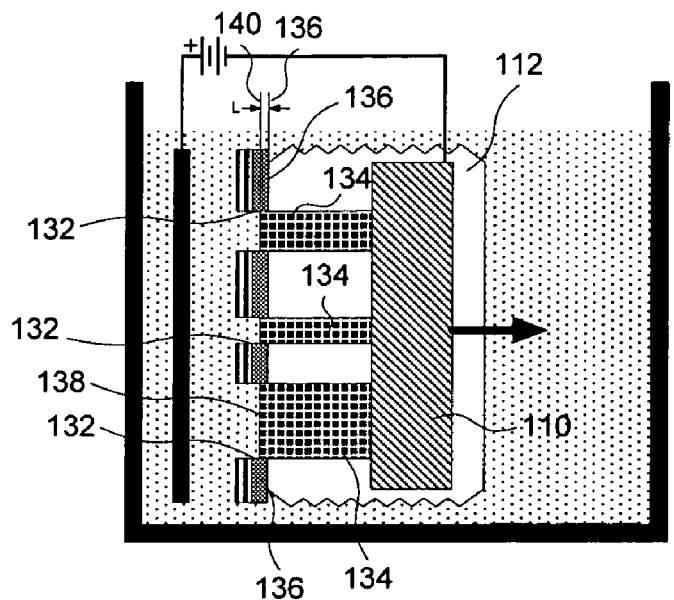
Figure 5E:
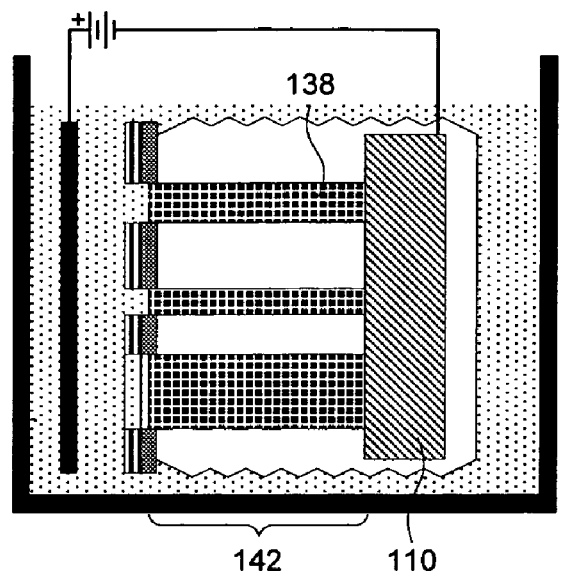
Figure 5F:
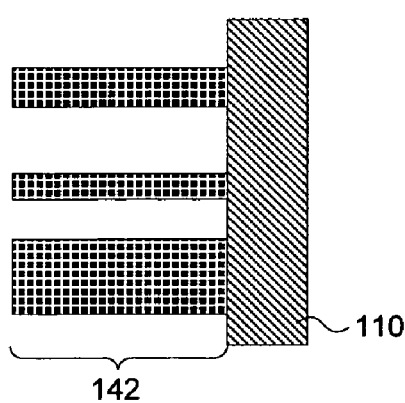

FIG. 5D depicts the state of deposition after the deposit thickness has grown to several times the thickness of the original mask and even more times the thickness of the conformable material portion 106 of the mask. FIG. 5E depicts the state of the process after the deposit 138 has grown to become the completed structure 142 has been completed to form the completed structure 142. FIG. 5F depicts the combined substrate 110 and structure 142 after being removed from the apparatus of FIGS. 5A-5E.

Figure 6:
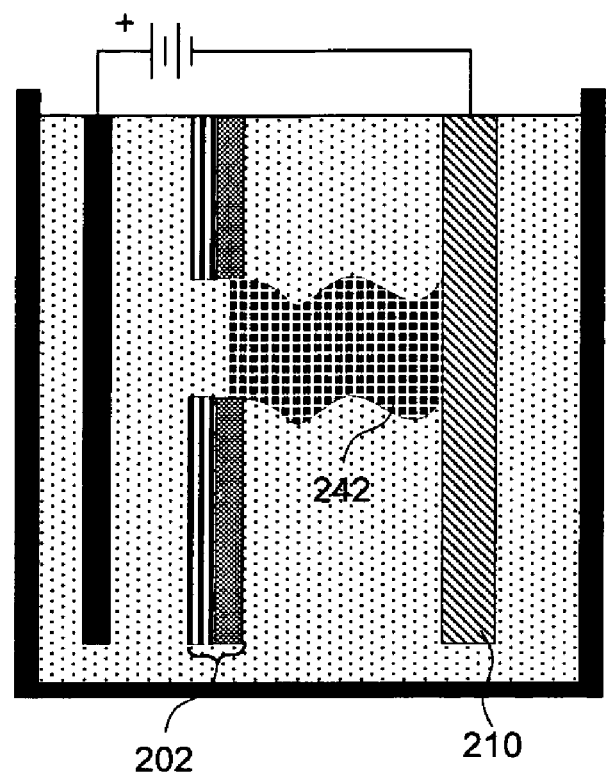
FIG. 6 depicts a side view of a structure formed according to a preferred embodiment where the motion between the mask and the substrate included both perpendicular movement and parallel movement such that a desired amount of lateral variation in the deposit occurred.

FIG. 6 illustrates a side view of a structure 242 formed by electrochemical extrusion of material onto substrate 210 via mask 202. During the formation of the structure 242 not only was there a perpendicular separation of the planes of the mask 202 and substrate 210 surfaces but there was also motion that had a component parallel to the planes of the mask and substrate surfaces. The parallel component of motion may include translational motion or may include rotational motion around an axis that has a component that is perpendicular to a plane of the mask surface (i.e. the face of the conformable material) or of a contact face of the substrate surface.

Figure 7A:
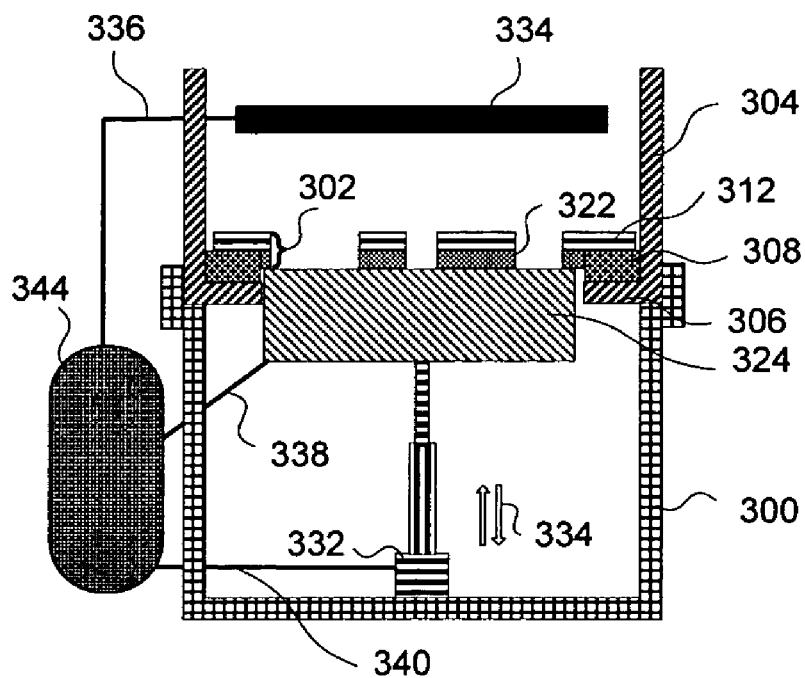
Figure 7B:
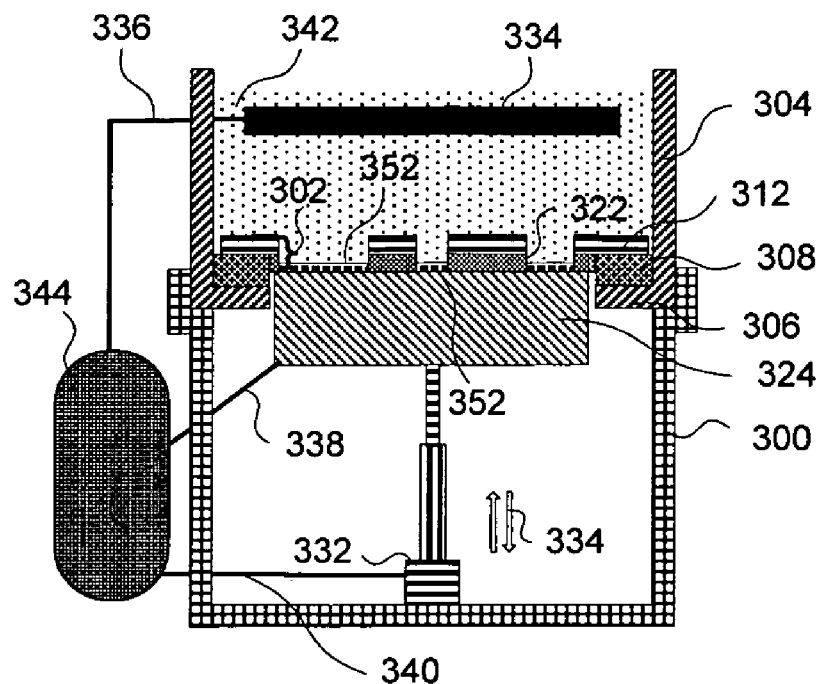
Figure 7C:
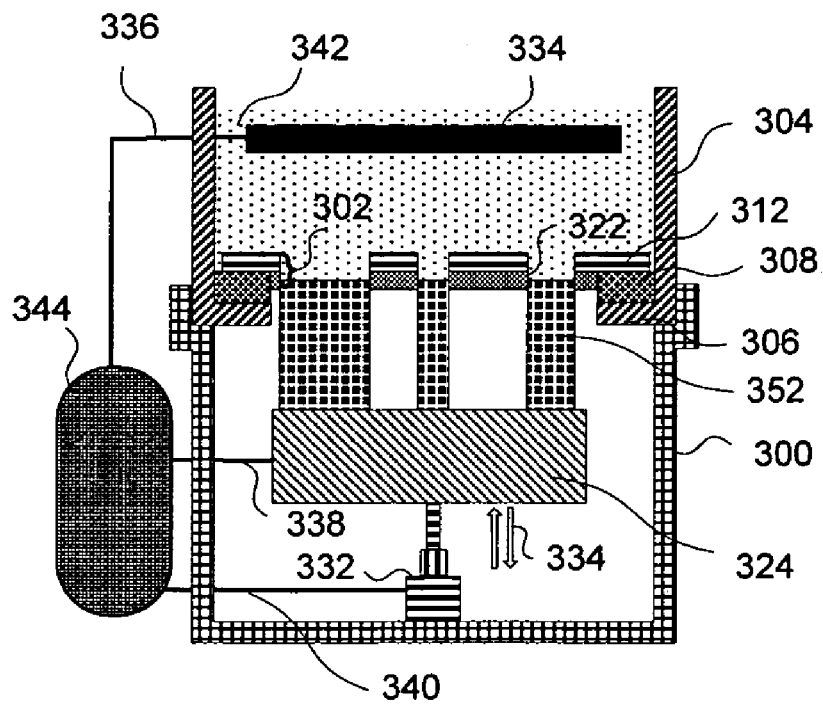

FIGS. 7A-7C illustrate another preferred embodiment where the bellows of the first embodiment is removed in favor of other structural components that inhibit deposition of material onto the sidewalls of the structure and onto the substrate (other than where initial openings in the mask expose selected portions of the substrate to electrolyte).

FIG. 7A depicts a base structure 300 on which an electrolyte reservoir 304 sits. A mask 302 sits on a gasket 308 located on a lower lip 306 at the bottom of the electrolyte reservoir 304. Of course, as opposed to just sitting on one another, in some embodiments the mask may be attached to the reservoir in any appropriate manner and similarly the reservoir may be attached to the base. On lip 306 and gasket 308, a support portion 312 of mask 302 sits while a conformable portion 322 of the mask is located on a lower surface of the support portion 312. One or more openings for the desired deposition pattern (in this example three are depicted) extend through both the conformable material and the support portion of the mask. A substrate 324 on which deposition is to occur is located below the mask on stage 332. Stage 332 is shown as having Z-movement capability 334 (i.e. movement capability in a direction substantially perpendicular to the plane of the substrate) but it is to be understood that for alignment purposes prior to beginning deposition or for varying the deposition pattern in the a plane parallel to the plane of the substrate, stage 332 could offer X and/or Y motion capability or rotational motion capability. FIG. 7A further shows that the apparatus includes an anode 334 that is located in electrolyte reservoir 304, electrical connections 336, 338, and 340 that connect the anode 334, the substrate 324, and the stage 332 to controller 344. During operation the controller supplies appropriate power to the anode and the substrate such that deposition onto the substrate occurs at a desirable rate and also supplies appropriate power to stage 332 such that the motion of the substrate 324 relative to the mask 302 is appropriately controlled.

As shown in FIG. 7B the conformable portion 322 of the mask 302 contacts the substrate 324, the electrolyte reservoir 304 is filled with electrolyte 342 such that anode 334 and substrate 324 are connected by a conductive path. Deposition begins formation of structure 352 prior to initiating any movement of the substrate 324. In FIG. 7C, a further stage of the process is shown where a deposition of significant height has been formed.

In some alternative embodiments the process may not begin with a face-to-face mating of the substrate and the mask (where the faces are considered to be the surfaces of the mask and the substrate that are substantially perpendicular to a direction of the height of the deposition). Instead the process may begin with a mating between the sidewalls of the mask and sidewalls of a protrusion that extends from the face of the substrate. Such an alternative process may be considered an add-on process, as the depositions that occur simply add to an existing structure. The initial protrusion may originate in many ways. For example, it may be from a molding operation, a previous extrusion operation, or a non-extrusion based conformable contact mask plating operation.

It is believed that these alternatives can be understood with reference to FIGS. 5E, 6, or 7C where the state of deposition in each may be considered a protrusion that extends from the substrate and onto which one or more further depositions will occur. As such these figures may be considered to be the starting point of the process. These starting points are achieved by mating the protrusion to the mask either in the presence of an electrolyte or subsequently surrounding the mated combination with electrolyte. After mating and electrolyte immersion, follow-on deposition occurs.

The follow-on deposition is preferably accompanied by relative movement between the mask and the substrate. However, in some embodiments the follow-on deposition may not be accompanied by such movement as the act of performing the deposition on an existing protrusion may be considered as a type of extrusion. In some embodiments, depositions may occur multiple times between mating and unmating operations where unmating and mating operations occur between relative movements of the mask and the substrate.

The controller 344 may take various forms. For example it may be a computer programmed to control deposition time, current level for the electrodeposition operations, start time for initiating relative movement between the substrate and the mask, or the rate of such movement or the amount and timing of discrete movements, and the like. In less automated embodiments the controller may be two or more discrete devices and/or independent devices. For example, it may include a separate power supply for the deposition operation and a separate power supply and/or controller for the stage. The deposition power supply may include an adjustment for setting current to a desired value (e.g. based on a desired current density). The movement of the stage may be controlled to begin after a predetermined deposition time, after a predetermined amount of charge as flowed or been transferred through the deposition system, or after a determined or estimated deposition height has been achieved. In some tests performed, it was found that a deposition thickness of about 20 microns before allowing the extrusion motion to begin resulted in reasonable sealing between the mask and the deposit during movement (i.e. no extraneous deposits or at least no excessive extraneous deposits were observed). Tests with a 10 micron thick deposition prior to initiating extrusion motion produced unsatisfactory results in those specific experiments. It is possible that in a given situation, thinner depositions prior to beginning extrusion motion could yield satisfactory results. It is within the level of skill in the art to determine a required minimum or at least a workable deposition thickness in a given situation.

Deposition may be terminated after a predetermined deposition time (a time estimated to produce the desired deposition height or a minimum deposition height to which the total deposition can be planed), after a predetermined amount of charge has flowed or been transferred through the deposition system, or after a determined or estimated deposition height has been achieved. In some alternative embodiments, deposition height may be periodically checked to ensure that movement and deposition are progressing as anticipated, corrective action may be taken as needed, and/or build parameters may be updated based on devised performance data. In some embodiments, the current may be set based on a desired current density and a known or estimated surface area for the deposition.

In some alternative embodiments, the movement between the mask and the substrate will be controlled in a manner that inhibits the deposition material from reaching a height within the mask that allows the deposited material to contact the support material. In other embodiments the deposition material will be allowed to contact the sidewalls of the support material The movement of stage 332 may be manually controlled, semi-automatically controlled, or automatically controlled (e.g. by a programmable device).

Figure 7D:
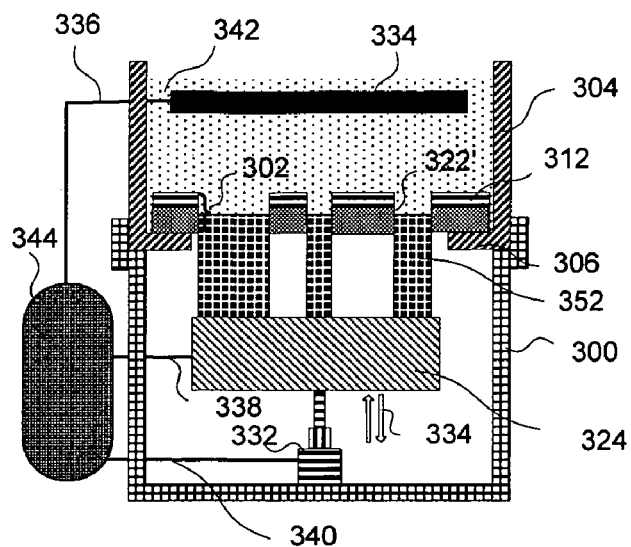
FIG. 7D depicts an alternate configuration for sealing the mask and reservoir 304.

In some alternative embodiments, sealing between the mask and the reservoir may occur via the conformable material that forms part of the mask. For example, the conformable material may have an outer diameter that mates with the opening through the bottom of the reservoir 304 (e.g. the inside dimension of lip 306) or it may extend completely across the support structure such that an outer ring of conformable material rests on the lip of the reservoir thereby potentially obviating the need for the gasket 308. This final alternative is shown in FIG. 7D.

In the most preferred embodiments the anode includes an erodable material that supplies the deposition material but in other embodiments the deposition material may be provided by other means (e.g. solely by the solution) in which case the anode may not need to be erodable.

In the most preferred embodiments the mask is of the anodeless type while in other embodiments the anode may form part of the mask. In some anodeless type embodiments, the openings through the support material may be identical in size and configuration to the opening holes through the support portion while in other embodiments the opening sizes in the conformable material may be larger or smaller than the openings through the support material.

Figure 10:
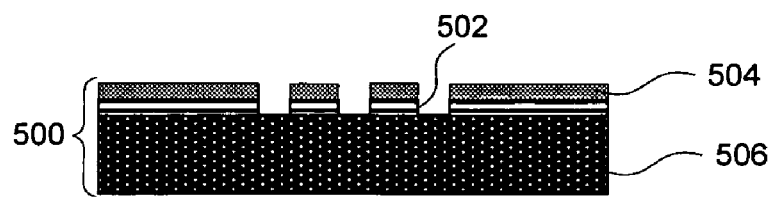
FIG. 10 depicts a side view of an alternate CC mask configuration that includes a porous support.

In still other embodiments, the support material may include a porous material and openings through the support portion may be paths through the pores. An example of a mask 500 with a porous support is shown in FIG. 10. A conformable portion 504 (e.g. PDMS) of the mask 500 is patterned and attached to a relatively thin solid support structure 502 (e.g. a thin silicon wafer) that is in turn bonded to a porous structure 506 (e.g. a glass frit). In the most preferred embodiments each of these three components would be dielectrics but in other embodiments the solid support and the porous structure can be conductive. It is believed that a p-type silicon material may be particularly advantageous as the solid support structure as it is believed to resist acceptance of deposits of material if the deposition height and relative motion of the mask and substrate allow the deposit to contact the solid support 502.

In some preferred embodiments the substrate material will be the same as the deposition material while in other embodiments the materials may be different. For example, the deposition material may be copper, nickel, gold, silver, an alloy, or the like, while the substrate material may be any of these materials or some other material and even a material that isn't readily depositable. As a further example, the substrate may be composed of pure nickel (99.98%) while the deposition material may come from an electrode (i.e. anode) of pure OFHC copper (99.95%). In some embodiments where copper is the deposition material, the electrolyte may be a copper plating bath, such as a copper sulfate acid bath (e.g. Techni Copper U or Techni Copper FB from Technic Inc. of Cranston, R.I.) or a copper pyrophosphate bath (e.g. Unichrome from Atotech USA Inc. of Somerset, N.J.).

The embodiment of FIG. 5 illustrated a sideways extrusion of the material while the embodiment of FIGS. 7A-7D illustrated a vertical extrusion of material where newly deposited material is added on top of previously deposited material. In still other embodiments the mask and substrate may take on other orientations, for example the substrate may be located above the mask. If the substrate is located above the mask any bubbles resulting from the deposition process may tend to get stuck within the mask against the substrate or previously deposited material and a method to remove such bubbles may be desirable (e.g. flowing of electrolyte, agitation of electrolyte, periodic separation with or without associated agitation or flow, and the like).

In some embodiments, the structures may take on more complex forms. For example, the deposition material may be changed so that a portion of the extruded structure is formed from one material while another extruded portion is formed from a different material. A first portion of the extruded structure may be formed with one mask pattern while another extruded portion may be formed with a different mask pattern. In still other embodiments one or more breaks in deposition may occur, followed by one or more planarization operations. In other embodiments one or more extrusion operations may be performed in combination with one or more non-extrusion type deposition operations (e.g. deposition operations that do not include relative movement between a mask and the substrate).

In some embodiments, a second material may be deposited either selectively or by blanket deposition. In some embodiments, single or multiple materials may be planarized (e.g. by lapping, grinding, chemical mechanical polishing, and the like) as a basis for further deposition operations either of the extrusion type or of the non-extrusion type. In some embodiments multiple deposition operations may not occur in a repeated registration with each other but may occur in a desired shifted or rotated registration with respect to each other. In some multiple material embodiments, the material deposited by extrusion may be a sacrificial material while in other embodiments it may be a structural material. In some embodiments selective and/or non-selective depositions may be performed by electroplating, electrophoretic deposition, CVD, PVD, and/or any other technique capable of locating a material in a desired pattern on a substrate.

In some embodiments, for example to allow clearing of bubbles or to allow refreshing of electrolyte, the deposition current may be shut off one or more times, the mask and deposition may be separated, the mask and the deposition realigned and contacted, and then the current reactivated. In some embodiments this shutting off, separating, re-contacting, and re-depositing may be accompanied by an intermediate planarization operation (e.g. lapping) so as to allow reestablishment of planarity of the deposit prior to continuing with further deposition. In still other embodiments, fresh electrolyte may be made to flow between the anode and the back side (i.e. the support side) of the mask and/or some agitation of the electrolyte may occur to help ensure maintenance of electrolyte properties. In embodiments where electrolyte is refreshed, replenished, or agitated, control of any pump or agitation actuator may occur via the same controller that handles deposition and separation.

In some embodiments, the mask may only include the conformable portion of the mask. The conformable portion of the mask preferably has sufficient conformability to allow easy separation of the mask and the deposit and to inhibit excessive amounts of electrolyte leakage between both the mask and the substrate and the mask and the deposit. In some embodiments, it may be found that sufficient conformability for such purposes is achieved without resorting to the need for a more rigid support structure.

The conformable contact masks of various embodiments may be formed in many different ways. The conformable material for some masks may be an elastomeric material, such as a rubber material, a urethane, or the like. A rubber material may be a silicone rubber, such as polydimethylsiloxane (PDMS). The supporting substrate or support may be a metal, silicon wafer, a relatively hard plastic or the like.

Some masks may be formed in a three step process that includes: (1) Design and fabrication of a photomask, (2) fabrication of a mold, and (3) fabrication of the mask. As some masks have feature sizes on the order of tens to hundreds of microns, the molds that may be used in patterning them may be considered micromolds.

Micromold fabrication may employ photolithography of a photoresist (such as is used in IC fabrication) to realize features on the microscale. One such photoresist is SU-8 (from Microchem Inc. of Newton, Mass.). SU-8 is a negative photoresist. It has good mechanical properties, can be adhered to silicon, and can be coated (e.g. from 1 µm to more than 500 µm) in a single operation to a desired thickness (e.g. 25 µm to 100 µm). Silicon wafers offer excellent flatness and smoothness which can be transferred to the contact surface of a conformable material that is patterned by an SU-8/silicon micromold.

Figure 8A:
FIGS. 8A-8D depict side views of various stages of a process for forming a mold that can be used for forming a CC mask.
Figure 8B:
Figure 8C:
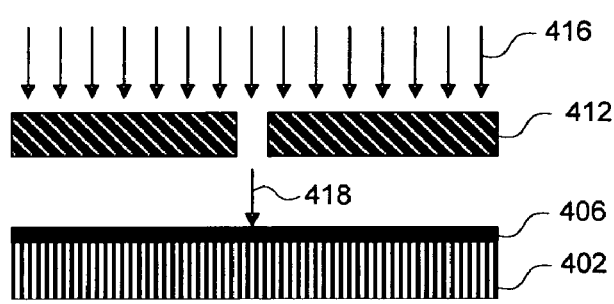
Figure 8D:
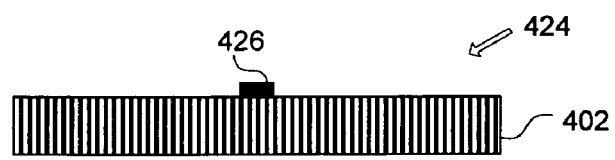

A process that can be used to fabricate an SU-8/silicon micromold is illustrated in FIGS. 8A-8D. FIG. 8A depicts a side view of a silicon wafer 402. FIG. 8B shows that a coating of photoresist 406 (e.g. SU-8) of desired thickness is applied to the surface of the wafer 402. FIG. 8C illustrates the use of a photomask 412 in combination with a source (not shown) of UV radiation 416 can be used to selective expose 418 the coating of photoresist 406. FIG. 8D depicts mold 424 that results from the development of the photoresist 406 that was patterned via of the exposure of FIG. 8C. In FIG. 8D a region of photoresist 426 (the portion of the resist that was exposed) remains on the silicon wafer 402.

Figure 9A:
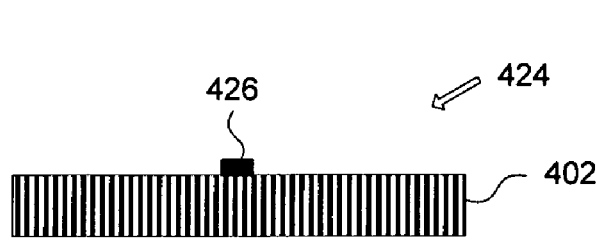
FIGS. 9A-9F depict side views of various stages of a CC mask formation process using the mold of FIGS. 8A-8D.
Figure 9B:
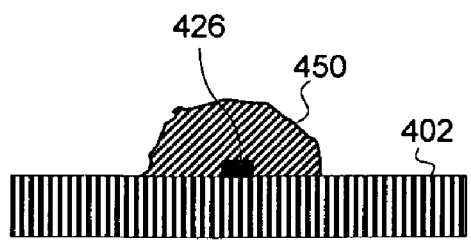
Figure 9C:
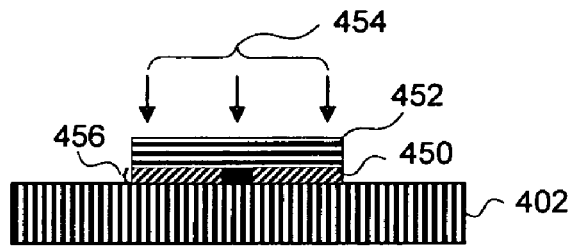
Figure 9D:
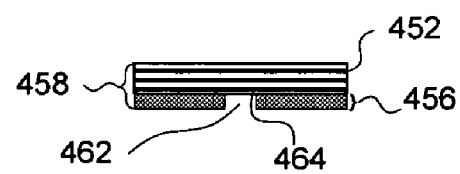
Figure 9E:
Figure 9F:

A process for using a mold, such as that shown in FIG. 8D to form a silicon/silicone mask, is depicted in FIGS. 9A-9F. The process includes the following operations or steps: (0) Start with a mold 424 as shown in FIG. 9A which includes base 402 and patterned photoresist 426, (1) Pour liquid PDMS 450 over photoresist pattern 426 of the mold 424 as shown in FIG. 9B, (2) degas the PDMS to remove air bubbles, (3) place a Si wafer 452 onto the PDMS 450, pressing it down as indicated by arrows 454 as shown in FIG. 9C and holding it in position (e.g. with a molding fixture), and putting the fixture in an oven at an elevated temperature (e.g. 65° C.) for a period of time sufficient to cure the PDMS (e.g. for about 6 hours) to form a pattern 456 of cured PDMS, (4) de-mold the partially formed mask 458 from the mold as shown in FIG. 9D. The partially formed mask may include a silicone residue 464 on the silicon 452 that is exposed in the opening 462 in the silicone, (5) use an etching operation (e.g. RIE) to remove any silicone residue from the silicon surface in the opening to yield a partially formed mask 458 with an opening that is free of silicone as shown in FIG. 9E, and (6) use deep reactive ion etching (DRIE) to etch through the silicon wafer to yield a completed anodeless mask 472 as shown in FIG. 9F. Prior to performing the coating operation of step (2) above, the surface of the photoresist and silicon wafer of the mold may be treated with a release agent that may aid in the de-molding process of step (4). Experiments have produced masks by this process where the resulting conformable material thickness is about 25 µm with a silicon thickness of about 300 µm.

In some embodiments, the silicon thickness could be reduced so as to reduce the required time to etch through it. For example, SOI wafers could be used. In other embodiments, a sacrificial film may be used to protect the conformable material (e.g. PDMS) during DRIE operations.

In some embodiments, sidewalls of an opening that extend through or into a mask and more particularly into the region of a rigid material that forms part of a mask may be configured or structured so that slippage between a deposition material and the sidewalls of the region can occur without causing significant damage to either the deposited material or the mask (e.g. damage that makes the structure being formed unusable for its intended purpose or damage that makes the mask unusable for continuing the extrusion process). A first example of such a configuration or structure involves forming the mask such that the openings through the conformable material are partially blocked by the support material (e.g. the openings through the conformable material are larger than the openings through the support material. A side view of a mask having such a configuration is shown in a FIG. 12B. A second example of such a configuration or structure involves forming a coating on the sidewalls. For example, such a coating might include polytetrafluoroethylene, e.g. TEFLON. Such coatings may be applied by any appropriate technique from PVD, i.e. physical vapor deposition, CVD, i.e. chemical vapor deposition, immersion in a solvent containing the coating material and removing the solvent (e.g. by evaporation). Such coatings may be applied to the sidewalls of surfaces during a DRIE, i.e. deep reactive ion etching, process.

In some embodiments, the selected electrolyte and the substrate may react with one another such that the electrolyte begins dissolving the substrate (e.g. via a corrosion process). Sulfate acid copper plating baths, a preferred electrolyte for the present invention when copper is to be selectively deposited, can react with nickel substrates in such a manner. When using such combinations, it may be desirable to plate a first coating of material over the substrate relatively quickly to avoid excess damage to the substrate. As the corrosion effect may be considered to be a current flowing in the opposite direction as that normally used in plating, it may be desirable to begin plating with a somewhat elevated plating current, such that the net current flow more closely approximates deposition using a desired current density than it otherwise would. In some embodiments, regardless of corrosion phenomena, the use of a higher initial current might be used solely for the purpose of getting a deposit down as quickly as possible. Once it is believed or known that the corrodible material (e.g. the substrate) is completed coated with the deposition material, the current may be lowered to yield a more desirable current density and associated plating rate.

Figure 11A:
FIGS. 11A-11D depict side views of various stages of a mask formation process that includes selective thinning of a substrate.
Figure 11B:
Figure 11C:
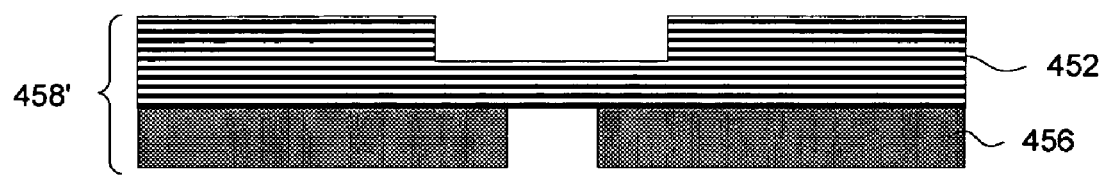
Figure 11D:
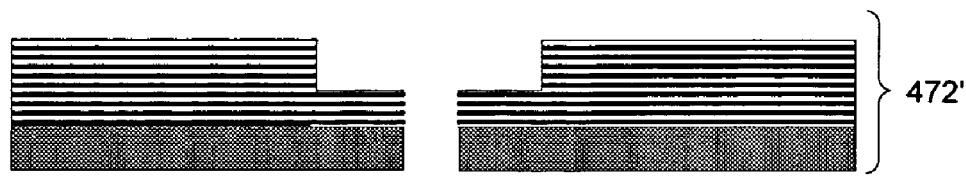

In some embodiments, it may be desirable to minimize the thickness of the support material. For example it may be done to lower an etching process time for the sake of speeding the process. It may be done to lower an etching (e.g. DRIE) process time so that etching induced peripheral damage and structural changes are minimized. It may also be done to improve the transfer between a volume of electrolyte within the openings of the masks and a larger volume of electrolyte outside the openings. Of course, thinning the entire support structure may be most beneficial in terms of improving electrolyte/ion transfer and for minimizing etching time (while the conformable material is present) but such global thinning may be impractical in some embodiments as it may excessively weaken the support structure. In some embodiments, selective thinning may be performed. An example of such a process is set forth in FIGS. 11A-11D. FIG. 11A starts with a structure 452 that is to be selectively thinned (e.g. a silicon wafer). FIG. 11B depicts a selectively thinned structure 452'. Selective thinning may have occurred via an etching operation, e.g. such as DRIE. FIG. 11C depicts a partially completed mask structure 458' after bonding of the thinned support structure 452' and a patterned conformable material 456. FIG. 11D depicts, a completed mask 472' after etching via the opening in the conformable material to open a hole through the thinned support structure 452'.

Figure 12A:
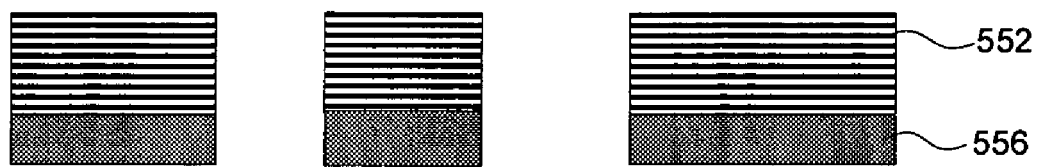
FIGS. 12A-12D depict various masks with non-coincident support and conformable materials regions.
Figure 12B:
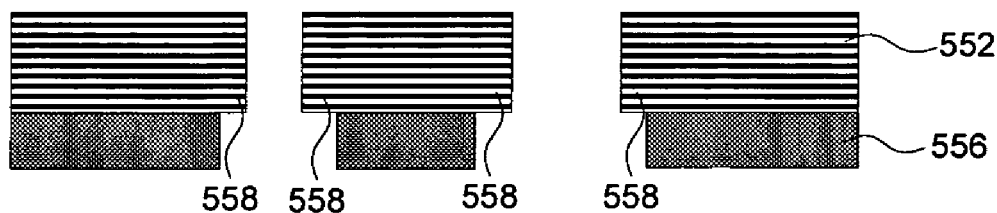
Figure 12C:
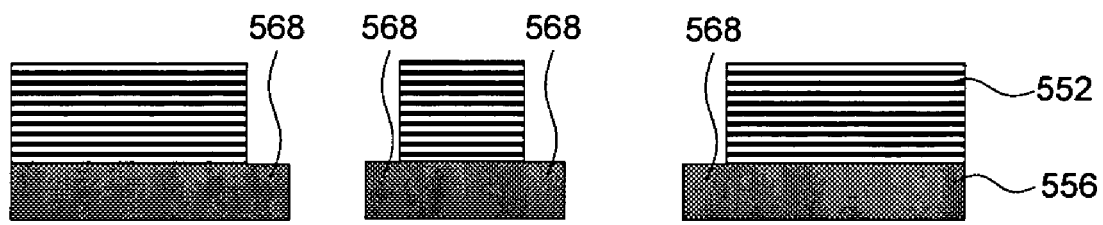
Figure 12D:
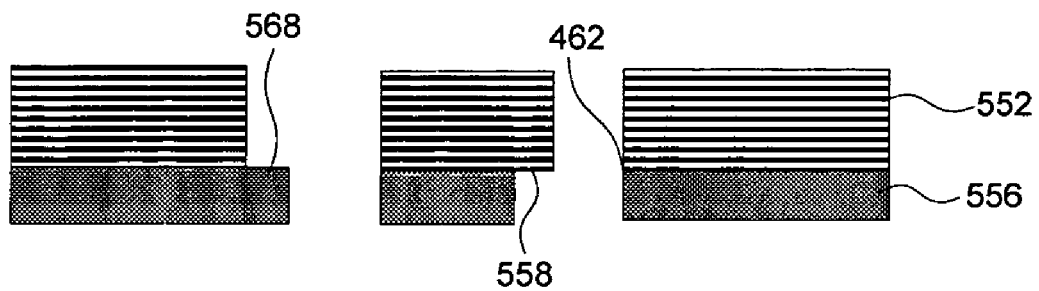

As noted above, masks can be formed with non-coincident sidewalls (i.e. sidewalls that do not meet at the same line or do not meet with parallel surfaces). Several such masks are illustrated in FIGS. 12A-12D. FIG. 12A depicts a side view of a mask having a support material 552 and a conformable material 556. In FIG. 12B the support material 552 is shown as having several extended portions 558 that overhang the conformable material 556. FIG. 12C shows the opposite situation of that shown in FIG. 12B where the conformable material has extended regions 568 that extend or overhang beyond the support material. FIG. 12D shows a mask that contains regions with no overhang 462, support material overhang 558, and conformable material overhang 568.

In some embodiments the thicknesses of the support material and conformable material are important and/or their relative thicknesses are important. As noted above, it is desirable to make the mask as thin as possible but practical reasons limit this ability. The conformable material should be thick enough to allow an adequate seal to form between its sidewalls and the sidewalls of any deposition. If it is desired that deposited material not extend far enough into the mask to contact the support material or some other material that is located beyond the conformable material, the conformable material must have additional thickness to account for variations in deposition depth, errors in matching mask movement to deposit grow and the like. On the other hand, to enhance resolution in the plane of the depositions, it is advantageous to minimize the thickness of the conformable material. Furthermore as noted above, the support material must be thick enough to provide adequate structure integrity for the mask. In this regard, in some embodiments, it is preferred that the conformable material having a thickness less than about 20% of a thickness of the support material, more preferably less than about 10% of a thickness of the support material, and most preferably less than about 5% of a thickness of the support material; and/or it is preferred that the conformable material have a thickness less than about 50 microns, more preferably less than about 20 microns, and most preferably less than about 10 microns. In some preferred embodiments the support material may be thinner than about 350 microns (μm) and even more preferably less than about 200 μm at least in a region around the at least one opening. In other embodiments the thicknesses and/or ratios may be greater while in still other embodiments they may be smaller.

Figure 13:
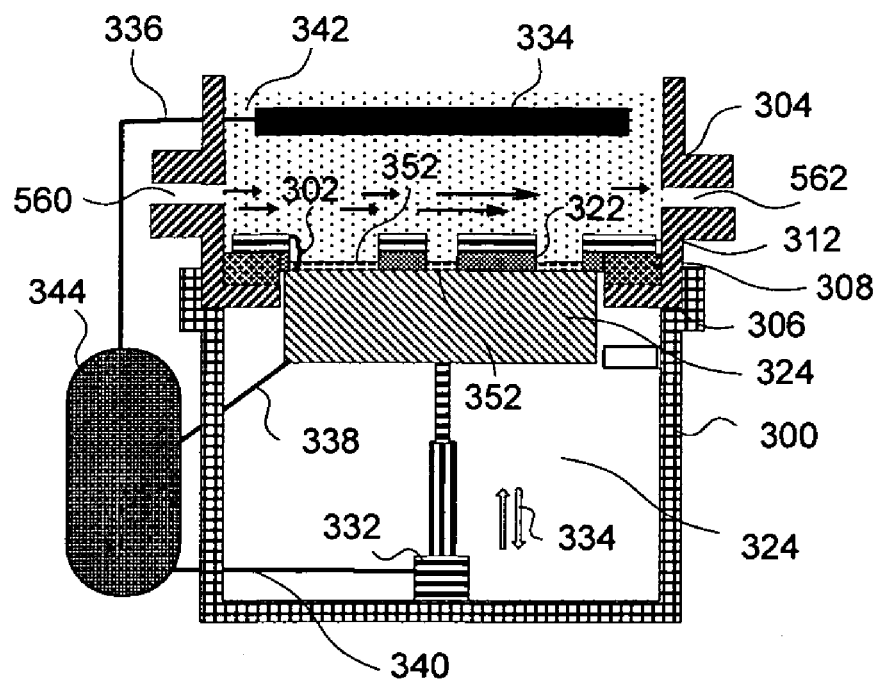
FIGS. 13-15 depict various embodiments that include electrolyte flow or agitation.
Figure 14:
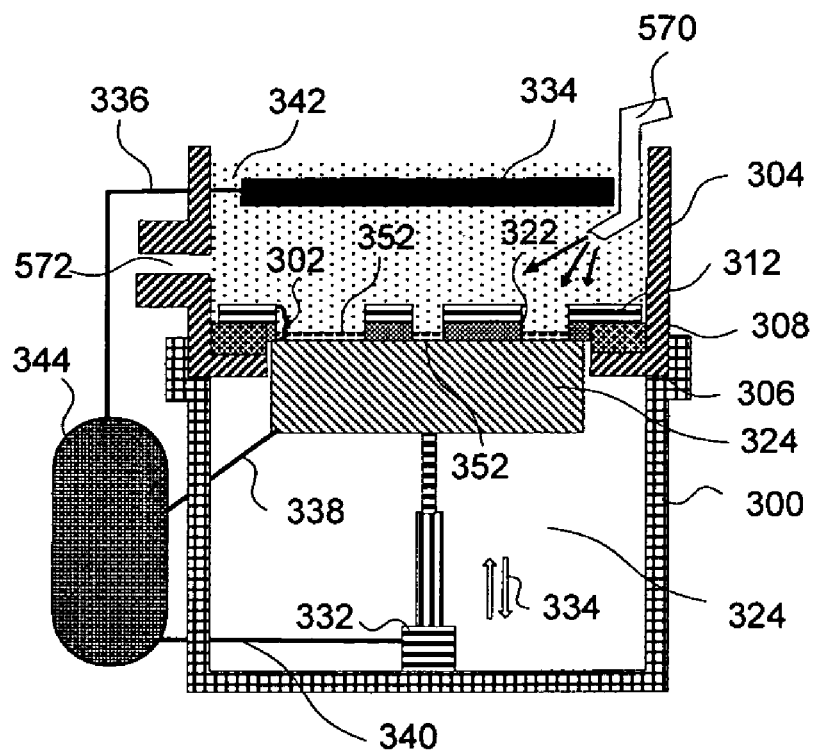
Figure 15:
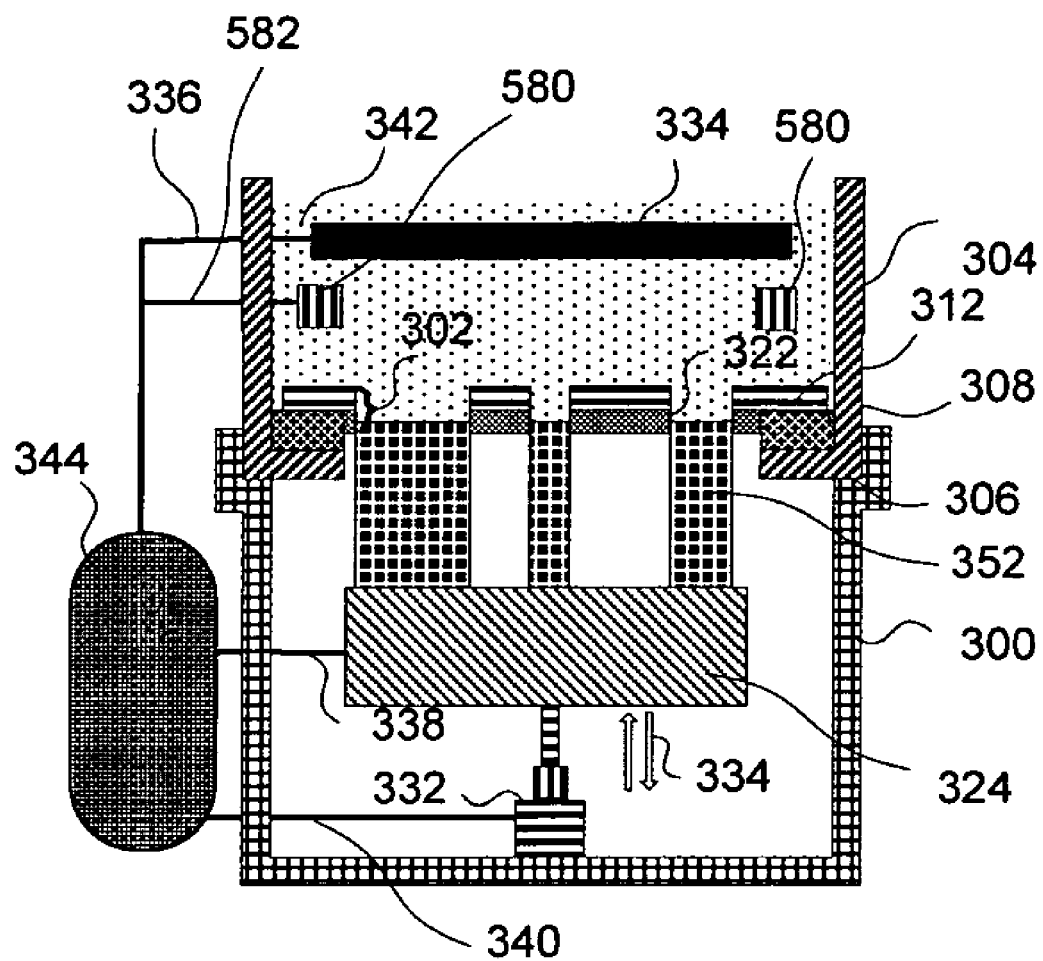

In some embodiments to maintain a desired freshness of the electrolyte, it may be advantageous to have a flow of fresh electrolyte through the reservoir and more preferably a flow in proximity to openings in the mask in hopes of enhancing the exchange of electrolyte between the cell openings (e.g. pockets) and the bulk of the electrolyte outside the openings. This is illustrated in FIG. 13 where an inlet 560 and outlet 562 can be used with appropriate tubing (not shown) and a pump (not shown) to cause a flow as indicated by the arrows that sweep between inlet and outlet and above the mask 302. In alternative embodiments the flow of material can be concentrated more directly on the mask. This is illustrated in FIG. 14, where nozzle 570 directs a flow of material in directions that have components not only parallel to the back surface of the mask but also perpendicular thereto as well. Outlet 572 functions to remove excess material from the reservoir 304. In still other embodiments, adequate refreshment may be gained from a recirculating flow of material or by an agitation of the electrolyte. FIG. 15 illustrates an embodiment where an agitation or vibration transducer 580, having a ring-like shape, and operating at an appropriate frequency and power level is located within reservoir 304. Line 582 is a control line that connects the transducer to controller 344. In some embodiments pumps, or the like, that control flow may be also controlled by controller 344. In other embodiments, a combination of flow and agitation may be used.

Figure 16A:
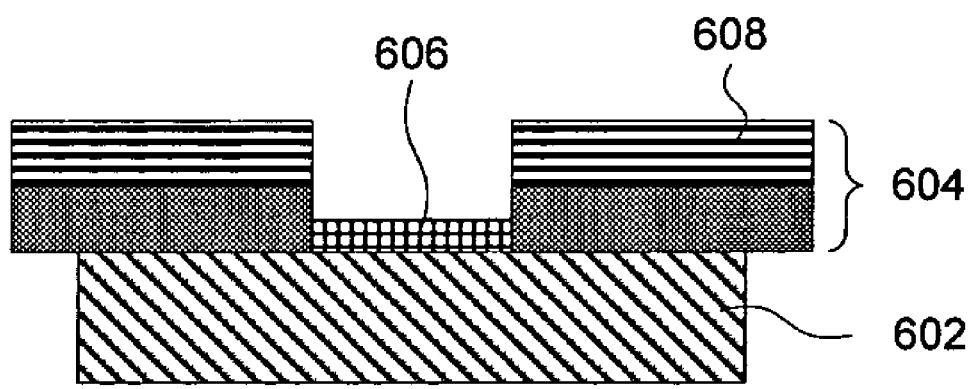
FIGS. 16A-16B illustrate the state of a deposition at two different times when the extrusion will occur using a mask that contracts.
Figure 16B:
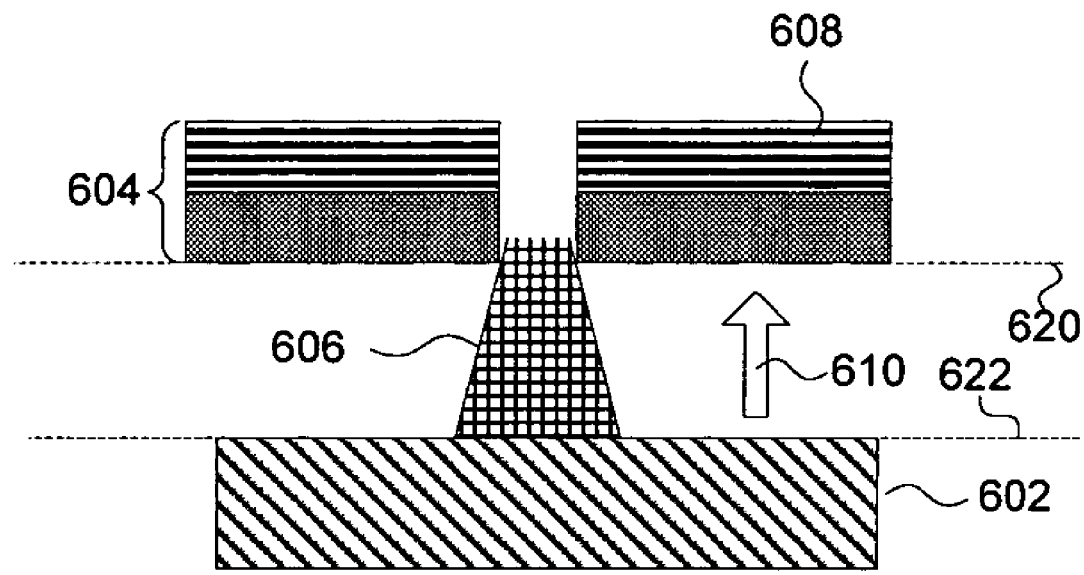

In some embodiments, operations and/or apparatus structure and functionality are provided so that the shape of a deposit can be deviated from an original extrusion shape. In particular, in some embodiments, processing is done to yield depositions with tapered sidewalls. In a first such embodiment the size of an opening in a mask is changed over time as deposition progresses so that the resulting deposit has an outer dimension that varies with the height of the deposition. Changing of mask size may occur by thermal means or by mechanical means. For example, the width of an opening in the mask may be varied by varying the temperature. The temperature may be varied by radiative transfer of energy or by conduction. As another example, a portion of a mask may be subjected to a contractive force or an expansive force to make an opening larger or smaller. A compressive force may be implemented via a ring of electrically resistive material that is embedded in the conformable material or sandwiched between a support and the conformable material. The ring of material could normally be held at an elevated temperature and then allowed to cool, as the material cooled and shrank, it could exert a compressive force on the conformable material causing the opening to contract. In a similar manner, the ring of material could be heated to cause it to expand which in turn could cause an expansive force to be exerted on the conformable material. In still other embodiments, the support material as a whole could be heated or cooled to cause a change in mask size. A deposit that has resulted from an opening contracting over time is depicted in FIGS. 16A and 16B. FIG. 16A starts with mask 604 mated with substrate 602 and with deposit 606 just beginning to form. As the deposit forms and as the mask is pulled away from the substrate, the mask is made to compress at a small but constant rate. FIG. 16B shows the state of the deposit after some period of time where deposit has grown in the direction 610 which is substantially perpendicular to the face of the mask 604 and the face of the substrate 602. The deposit's dimensions measured parallel to the planes 620 and 622 of faces the mask and substrate respectively have decreased as a result of changes made to the effective size of the mask. In this example, the entire support 608 for the mask may have been made to contract, for example via cooling by embedded heating elements whose power is being slowly turned down, by slow withdrawal of radiative heating, or by otherwise cooling the substrate (and potentially even the bath too). In other embodiments, the deviation in size need not vary uniformly over the height of the deposition. Instead it may oscillate between larger and smaller sizes or may continue to expand or contract but at varying rates.

Figure 16C:
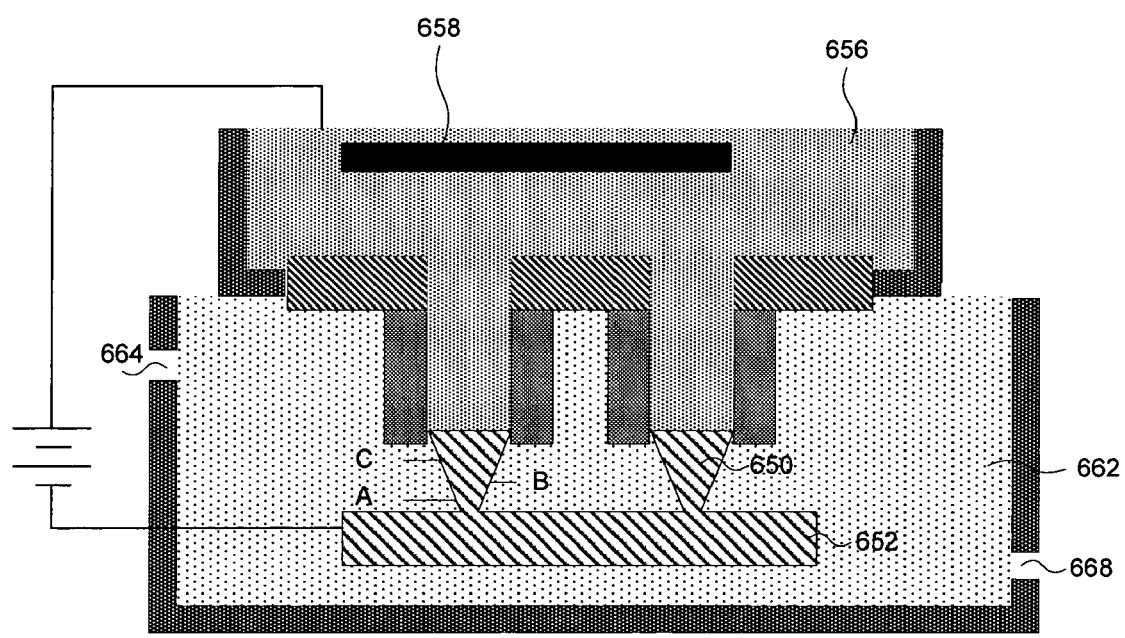
FIG. 16C illustrates an embodiment where in situ etching occurs.

In still other embodiments deviation in size may occur without changing the size of the mask but instead by immersing the growing structure in an etchant or by immersing the completed structure into an etchant using a controlled immersion rate and or extraction rate. An example of in situ etching (etching that occurs in the apparatus that does the deposition operations and which potentially occurs at the same time as deposition) is shown in FIG. 16C wherein a deposit 650 is being formed on substrate 652 via current flow from anode 658 through electrolyte 656. As earlier formed portions of the deposit 650 become unmated from the sidewalls of the mask, the structures enter volume 662 which holds an etchant that attacks the deposit. As earlier formed levels A and B of the deposit 650 have been immersed in the etchant for longer periods of time than levels B and C, respectively, they are more deeply etched than the latter levels. To obtain the desired result the etching rate should be matched to the deposition rate and to the overall height of the structure to be formed. For a chemical etchant, the etching rate can be varied by controlling the concentration of the etchant and or the temperature of etchant in etching volume 662. In some preferred embodiments, fresh etchant may be flowed into volume 662 via an inlet 664 and an outlet 668. In some embodiments, the etching process may be performed electrochemically where a second power supply would be included in the system along with an etching cathode (the deposit 650 will function as an anode for etching).

In still other embodiments the extruded structure may be formed without a deviation. The extruded structure may thereafter be immersed into a chemical etchant or into an electrochemical etchant (and associated electric connections) where the portion immersed first and extracted last will undergo more etching than the portion immersed last and extracted first. In some embodiments the structure may be immersed substrate first (i.e. foot first) while in other embodiments it may be immersed head first). In still other embodiments immersion and withdrawal may occur at different rates and even with different orientations.

Figure 17:
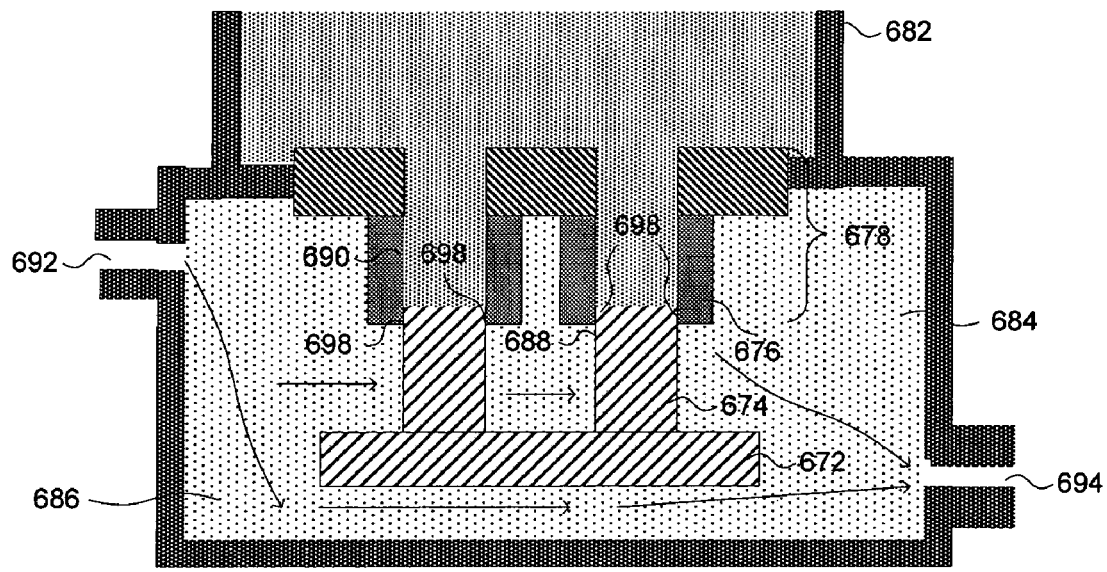
FIG. 17 depicts an embodiment that includes a liquid for inhibiting deposition from leakage between a mask and an extruded deposit.

In some embodiments, negative effects associated with leakage of electrolyte between the mask sidewalls and the deposit sidewalls may be reduced or substantially eliminated. This may be done by flowing a cleaning or diluting liquid around those portions of the deposit that have been unmated from the mask. This cleaning or diluting liquid may reduce the ability of any depositions to be made to the sidewalls of the deposit as a result of leaking electrolyte. This alternative is illustrated in FIG. 17. Deposit 674 is supported by substrate 672 as it leaves conformable portions 676 of mask 678. The upper portion of the mask 678 is located at the lower end of electrolyte reservoir 682 and a fluid 686 (e.g. water) is flowed through volume 684 via a pump and tubing (not shown) via inlet 692 and outlet 694. The presence of the liquid (e.g. water) may inhibit leakage of electrolyte from the sealing region 698 between mask sidewalls 690 and deposit sidewalls 688.

In some embodiments the cleaning or diluting liquid may be slightly pressurized (relative to the pressure the electrolyte exerts on the seal, to help mate the mask sidewalls to the deposit sidewalls. In still other embodiments a gas may be used to assist in such mating. If necessary, the gas pressure can be reduced during periods of relative movement between the mask and the substrate to reduce inhibition to slippage.

Figure 18:
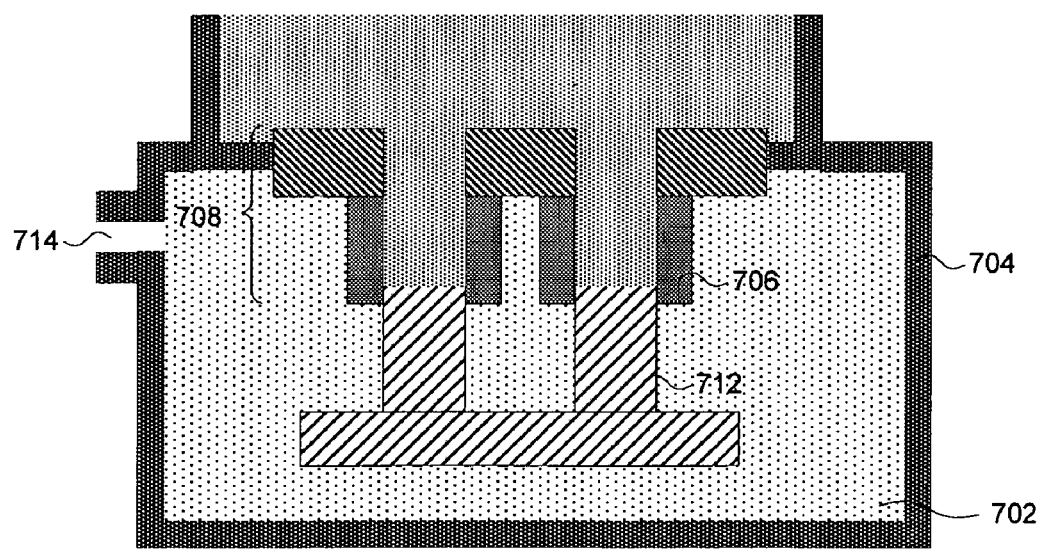
FIG. 18 depicts an embodiment that can use gas or vacuum pressure to modify extrusion results.

In some embodiments, the use of a gas pressure or even a vacuum pressure in a closed chamber on the substrate side of the mask may be used to vary the size of the mask and thus may be used to cause contraction or expansion of deposition regions. This may be understood further with the aid of FIG. 18 where a volume 702 gas or fluid is enclosed by chamber 704 and it in turn encloses the conformable portion 706 of the mask 708 and the deposit 712. A gas or fluid pressure may be applied to volume 702 or a vacuum force may be exerted on volume 702 via an appropriate pump and tubing attached to port 714. Because the conformable material is pliable, the pressure may help to seal the conformable material to the deposit. A pressure may also cause conformable material to bow inward and thus cause a deviation in the shape of the extrusion. A vacuum force may also result in a deviation in the shape of the extrusion as the conformable material is pulled outward.

Figure 19:
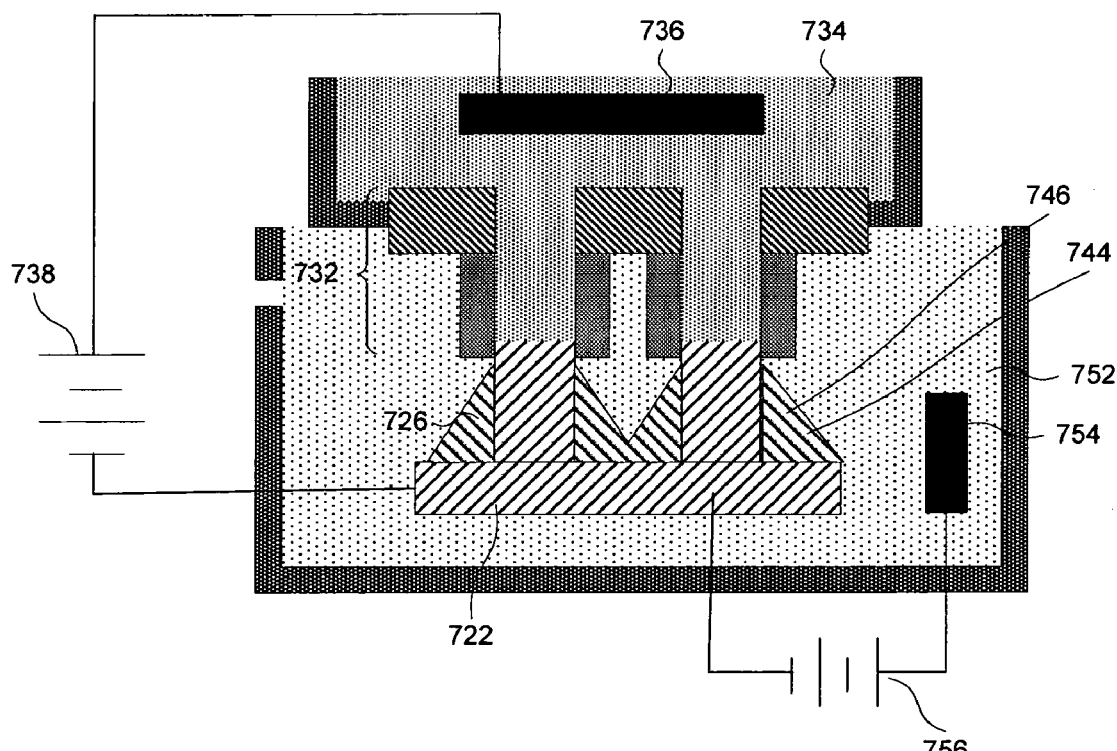
FIG. 19 depicts and embodiment where simultaneous deposition and extrusion of one material can occur along with the deposition of a second material.

In some embodiments, as the deposit is extruded from the mask, the portion of the deposit between the substrate and seal may undergo a deposit of a second material. The second material deposit may be made by (1) supplying a second anode composed of the second material to be deposited, (2) treating the upper surface of the substrate and sidewalls of the deposit as a cathode, and (3) supplying an electrolyte between the deposit, the substrate, and the anode. Thus, as the deposit is growing and being extruded in one material a second material may be formed around the first deposit. This second material may be formed in a continuous manner at the same time that the extrusion is taking place or it may be formed in a periodic manner, or even in an alternating manner with the extruded material itself. After completion of extrusion and deposition of the second material, if desired, the two neighboring deposits may be planarized to yield a multi-material deposit of uniform thickness. If desired, the extruded material may be considered a sacrificial material and it may be removed to yield a desired structure formed from the second material. The set up for this process is illustrated in FIG. 19. The substrate 722 holds deposited material. The substrate 722 acts as a cathode for the extrusion process which deposits a first material 726 via mask 732, electrolyte 734, anode 736, and power supply 738. After the substrate initially moved away from mask 732, a second deposition operation was initiated on that portion of the deposit that slipped out of mask 732 to form deposit 744 of a second material 746 via a second electrolyte 752, a second anode 754, and a second power supply 756.

Figure 20A:
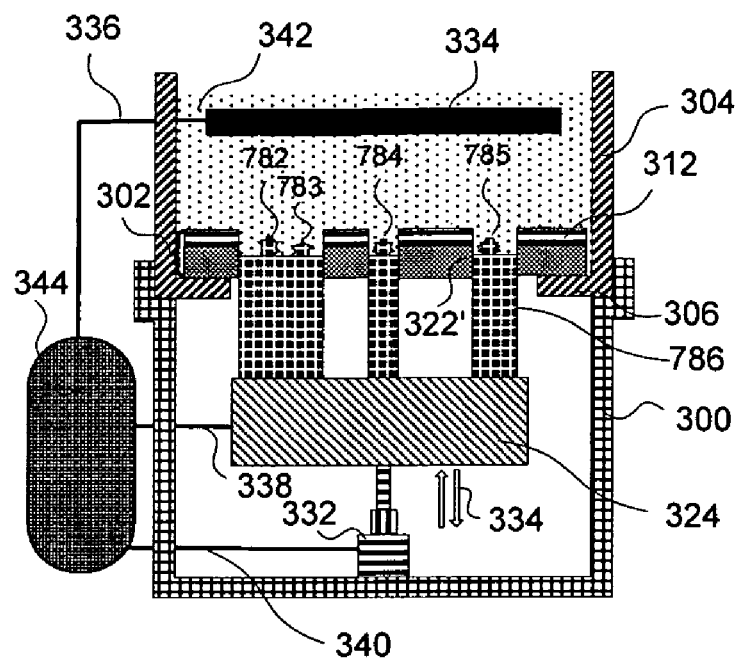
FIGS. 20A-20B depict a process where extrusion irregularities can be reduced by using one or more reverse plating operations.
Figure 20B:
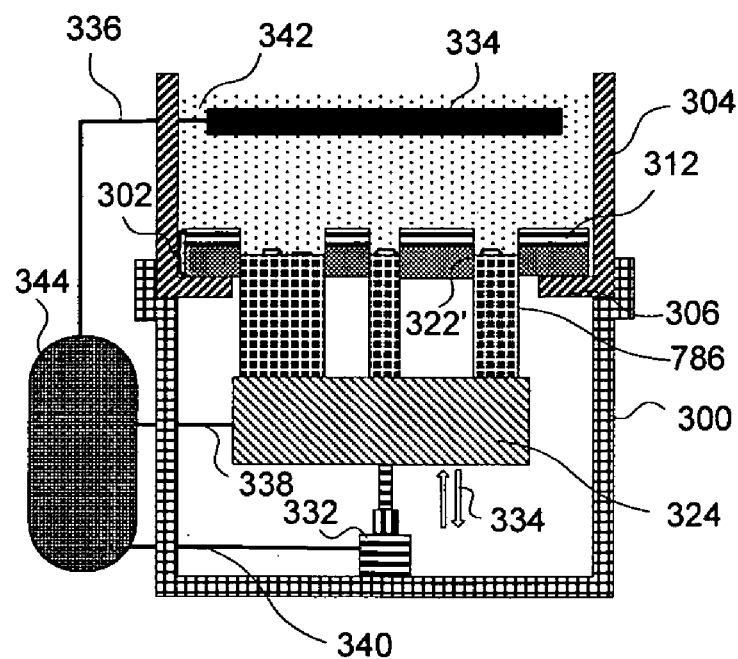

In some embodiments, the current that is responsible for forming the deposit may be shut off or otherwise interrupted to allow a reverse current of desired magnitude and duration to be performed. This reverse current will treat the deposit as an anode and may treat the original anode as a cathode or it may use an entirely different cathode. The reverse current can be used to selectively decrease sharp features on the deposition (i.e. regions of excess height). This reversal process may help eliminate shorting or improve uniformity of the deposit thickness. The forward and reverse plating processes may be repeated multiple times during the extrusion process. A portion of this process is illustrated in FIGS. 20A and 20B. FIG. 20A depicts the extrusion process where irregularities 782-785 have formed on deposit 786 at the working surface of the deposition operation. These irregularities can tend to worsen as deposition continues. According to this embodiment, these irregularities can be reduced by reversing the deposition polarity of the anode and the cathode via controller 344. The reversed polarity will cause etching of the deposit 786 but with more aggressive attack of the irregularities 782-785 than of the bulk deposit. After the irregularities have been reduced in size, the current is reset to it original polarity and extrusion continues. The polarity reversal operation can occur multiple times with the net current flow resulting in the growth of the deposit but with the reversed current aiding in obtaining a more uniform deposition. In other embodiments a different cathode may be used (i.e. not the anode that is used during normal deposition).

Figure 21A:
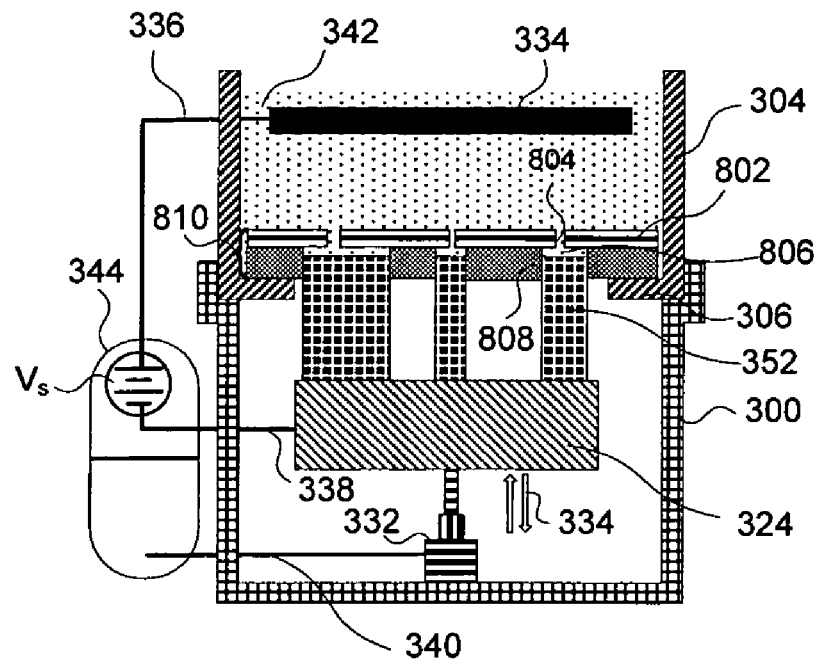
FIGS. 21A-21D and FIGS. 22A-22C depict systems where deposit position within the mask can be ascertained via detection of electrical parameters.
Figure 21B:
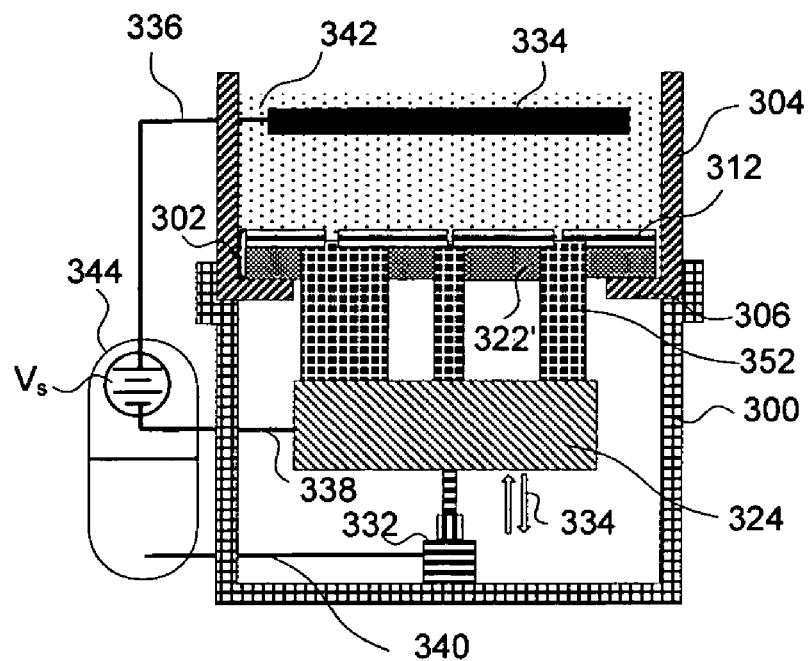

It is believed that deposition level within a mask may be detectable by monitoring plating voltage. FIGS. 21A and 21B depict situations where the deposit levels are at two different positions relative to the mask where the support portions extend into but do not completely block the opening that extends through the conformable material. If a mask is used that has a support structure 802 with a smaller opening 804 than the a corresponding opening 806 in the conformable portion 808 of the mask 810, then if the deposit level should reach the level of the narrowed opening, as shown in FIG. 21B, a change in voltage should be detectable and thus recognition that the mask and substrate must undergo further and possibly even faster separation can be made and appropriate action taken. In other embodiments, it is believed that other electrical parameters and properties can be monitored to ascertain the position of the deposit relative to the mask.

Figure 21C:
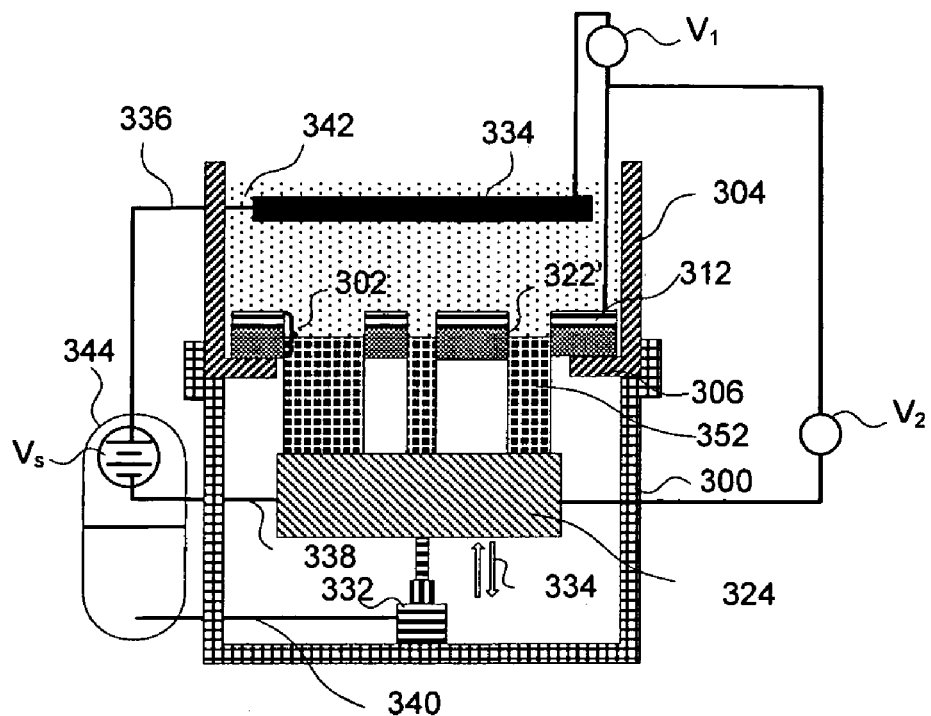
Figure 21D:
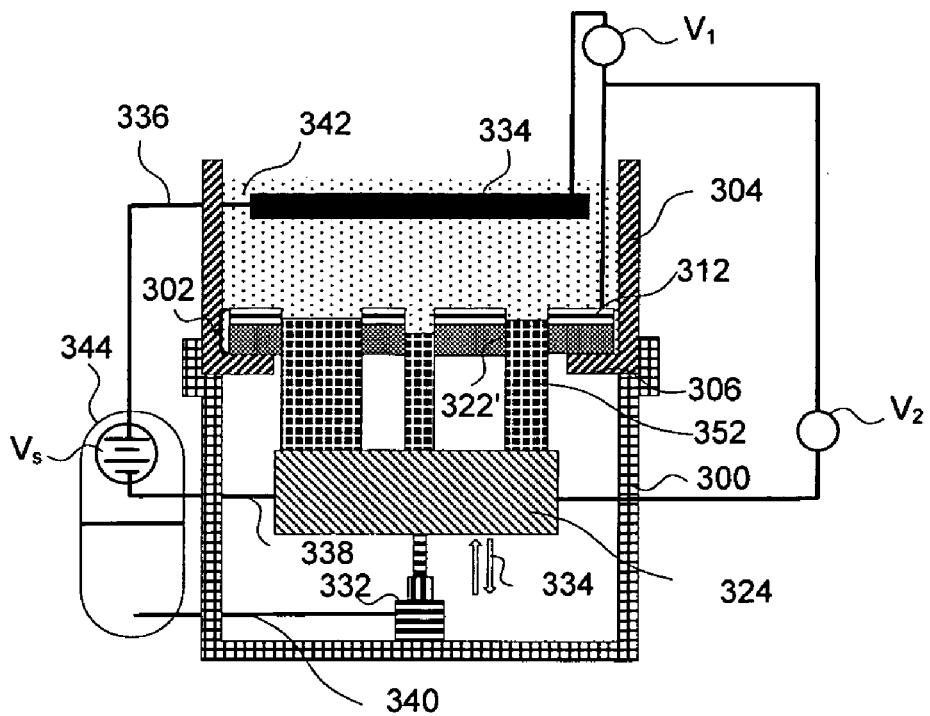

Other embodiments of detecting deposition position within the mask are illustrated in FIGS. 21C-21D and 22A-22C. FIG. 21C depicts a deposition 352 that is contacting the conformable portion 322 of mask 302 but not contacting support portion 312. FIG. 21D depicts a situation where the deposit 352 is contacting support portion 312. In some embodiments a voltage between a conductive (or partially conductive) mask support 312 and the anode 334 or the cathode 324 can be monitored by volt meters to obtain V1 or V2 respectively. If V1 does not equal Vs (the voltage across the anode and cathode as supplied by controller 344) then the deposit is below the support material but if V1 equals or approximates Vs then the deposit has reached the height of the support material. If the voltage on V2 is not zero, then the deposit has not reached the support material but if it is zero then the deposit has reached the support material. If the support material has been reached it may be desirable to perform an immediate incremental movement between the support and the mask and/or to appropriately increase a rate of movement between the support and the mask.

Figure 22A:
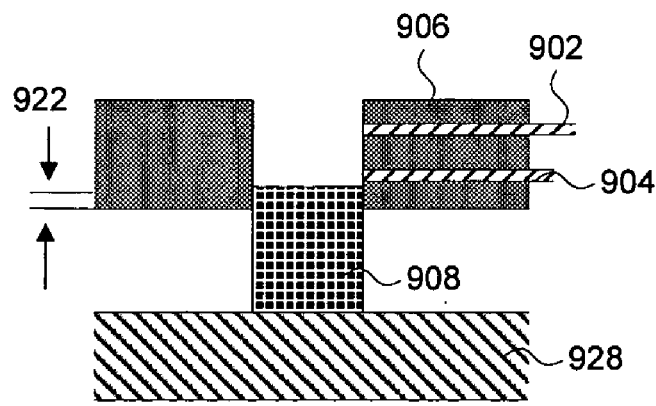
Figure 22B:
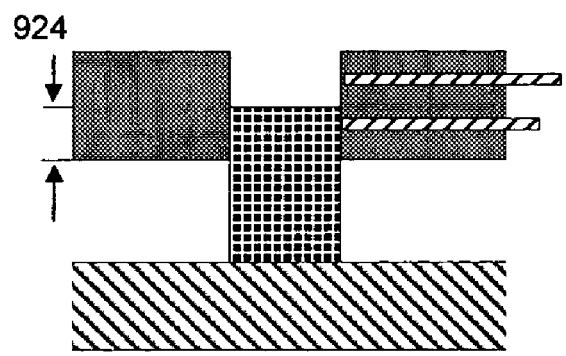
Figure 22C:
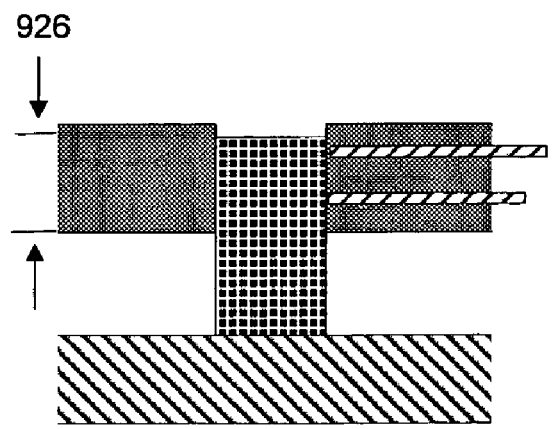

FIGS. 22A-22C depict an embodiment where level detection elements 902 and 904 are located at two levels within the mask 906. In such embodiments it may be possible to use detected voltage levels to differentiate three distinct relationships between the mask 906 and the deposit 908. For example, the "too low" position 922 (i.e. not sufficient overlap between the mask and the deposit) of FIG. 22A, can be ascertained by both detectors reading the same value (e.g. neither one reads a zero voltage relative to the substrate 928). The "just right" level 924 (i.e. a deposition location level between the levels of detectors 902 and 904) of FIG. 22B can be ascertained by the detectors reading opposing values (e.g. the lower detector 904 reads zero volts while the upper detector 902 does not read zero volts relative to the substrate. The "too high" level 926 of FIG. 22C can be ascertained by both detectors reading the same value (e.g. both reading a zero voltage value relative to the substrate. In other embodiments it is believed that other electrical properties and parameters can be detected. For example a capacitance reading or an inductance reading may be used instead of the voltage readings exemplified above. In still other embodiments, the support structure may be split into multiple levels of conductors and non-conductors such that each conductive level can be used to ascertain information about the level of the deposit relative to the mask. In some embodiments it is believed that detection can occur without conductive elements contacting the electrolyte.

The patent applications in the following table are hereby incorporated by reference herein as if set forth in full. The gist of each patent application is included in the table to aid the reader in finding specific types of teachings. It is not intended that the incorporation of subject matter be limited to those topics specifically indicated, but instead the incorporation is to include all subject matter found in these applications. The teachings in these incorporated applications can be combined with the teachings of the instant application in many ways. For example, the various apparatus configurations disclosed in these referenced applications may be used in conjunction with the novel features of the instant invention to provide various alternative apparatus that include the functionality disclosed herein:

| U.S. application Ser. No. Filing Date | Title Brief Description |
|---|---|
| U.S. application Ser. No. 09/488,142 Jan. 20, 2000 | Method for Electrochemical Fabrication This application is a divisional of the application that led to the above noted '630 patent. This application describes the basics of conformable contact mask plating and electrochemical fabrication including various alternative methods and apparatus for practicing EFAB as well as various methods and apparatus for constructing conformable contact masks |
| U.S. application Ser. No. 09/755,985 Jan. 5, 2001 | Microcombustor and Combustion-Based Thermoelectric Microgenerator Describes a generally toroidal counterflow heat exchanger and electric current microgenerator that can be formed using electrochemical fabrication. |
| U.S. application Ser. No. 60/379,136 May 7, 2002 | Selective Electrochemical Deposition Methods Having Enhanced Uniform Deposition Capabilities Describes conformable contact mask processes for forming selective depositions of copper using a copper pyrophosphate plating solution that allows simultaneous deposition to at least one large area (greater than about 1.44 $mm^2$) and at least one small area (smaller than about 0.05 $mm^2$) wherein the thickness of deposition to the smaller area is no less than one-half the deposition thickness to the large area when the deposition to the large area is no less than about 10 μm in thickness and where the copper pyrophosphate solution contains at least 30 g/L of copper. The conformable contact |

-continued

| U.S. application Ser. No. Filing Date | Title Brief Description |
|---|---|
| | mask process is particularly focused on an electrochemical fabrication process for producing three-dimensional structures from a plurality of adhered layers. |
| U.S. application Ser. No. 60/379,131 May 7, 2002 | Selective Electrodeposition Using Conformable Contact Masks Having Enhanced Longevity<br>Describes conformable contact masks that include a support structure and a patterned elastomeric material and treating the support structure with a corrosion inhibitor prior to combining the support and the patterned elastomeric material to improve the useful life of the mask. Also describes operating the plating bath at a low temperature so as to extend the life of the mask. |
| U.S. application Ser. No. 60/379,132 May 7, 2002 | Methods and Apparatus for Monitoring Deposition Quality During Conformable Contact Mask Plating Operations<br>Describes an electrochemical fabrication process and apparatus that includes monitoring of at least one electrical parameter (e.g. voltage) during selective deposition using conformable contact masks where the monitored parameter is used to help determine the quality of the deposition that was made. If the monitored parameter indicates that a problem occurred with the deposition, various remedial operations are undertaken to allow successful formation of the structure to be completed. |
| U.S. application Ser. No. 60/329,654 Oct. 15, 2001 | "Innovative Low-Cost Manufacturing Technology for High Aspect Ratio Microelectromechanical Systems (MEMS)"<br>This is the parent application for the present application and describes a conformable contact masking technique where the depth of deposition is enhanced by pulling the mask away from the substrate as deposition is occurring in such away that the seal between the conformable portion of the mask and the substrate shifts from the face of the conformal material and the opposing face of the substrate to the inside edges of the conformable material and the deposited material. |
| U.S. application Ser. No. 60/379,129 May 7, 2002 | Conformable Contact Masking Methods and Apparatus Utilizing In Situ Cathodic Activation of a Substrate<br>Describes an electrochemical fabrication process benefiting from an in situ cathodic activation of nickel where prior to nickel deposition, the substrate is exposed to the desired nickel plating solution and a current less than that capable of causing deposition is applied through the plating solution to the substrate (i.e. cathode) to cause activation of the substrate, after which, without removing the substrate from the plating bath, the current is increased to a level which causes deposition to occur. |
| U.S. application Ser. No. 60/379,134 May 7, 2002 | Electrochemical Fabrication Methods With Enhanced Post Deposition Processing<br>Describes an electrochemical fabrication process for producing three-dimensional structures from a plurality of adhered layers where each layer includes at least one structural material (e.g. nickel) and at least one sacrificial material (i.e. copper) that will be etched away from the structural material after the formation of all layers have been completed. A copper etchant containing chlorite (e.g. Enthone C-38) is combined with a corrosion inhibitor (e.g. sodium nitrate) to prevent pitting of the structural material during removal of the sacrificial material. |
| U.S. application Ser. No. 60/364,261 Mar. 13, 2002 | Electrochemical Fabrication Method and Apparatus for Producing Three-Dimensional Structures Having Improved Surface Finish<br>Describes an electrochemical fabrication (e.g. EFAB ™) process and apparatus provided that remove material deposited on at least one layer using a first removal process that includes one or more operations having one or more parameters, and remove material deposited on at least one different layer using a second removal process that includes one or more operations having one or more parameters, wherein the first removal process differs from the second removal process by inclusion of at least one different operation or at least one different parameter. |
| U.S. application Ser. No. 60/379,133 May 7, 2002 | Method of and Apparatus for Forming Three-Dimensional Structures Integral With Semiconductor Based Circuitry<br>Describes an electrochemical fabrication (e.g. by EFAB ™) process and apparatus that can form three-dimensional multi-layer structures using semiconductor based circuitry as a substrate. Electrically functional portions of the structure are formed from structural material (e.g. nickel) that adheres to contact pads of the circuit. Aluminum contact pads and silicon structures are protected from copper diffusion |

-continued

| U.S. application Ser. No. Filing Date | Title Brief Description |
|---|---|
| | damage by application of appropriate barrier layers. In some embodiments, nickel is applied to the aluminum contact pad via solder bump formation techniques using electroless nickel plating. |
| U.S. application Ser. No. 60/379,176 May 7, 2002 | Selective Electrochemical Deposition Methods Using Pyrophosphate Copper Plating Baths Containing Citrate Salts Describes an electrochemical fabrication (e.g. by EFAB ™) process and apparatus that can form three - dimensional multi-layer structures using pyrophosphate copper plating solutions that contain a citrate salt. In preferred embodiments the citrate salts are provided in concentrations that yield improved anode dissolution, reduced formation of pinholes on the surface of deposits, reduced likelihood of shorting between anode and cathode during deposition processes, and reduced plating voltage throughout the period of deposition. A preferred citrate salt is ammonium citrate in concentrations ranging from somewhat more that about 10 g/L for 10 mA/cm$^2$ current density to as high as 200 g/L or more for a current density as high as 40 mA/cm$^2$. |
| U.S. application Ser. No. 60/379,135 May 7, 2002 | Methods of and Apparatus for Molding Structures Using Sacrificial Metal Patterns Describes molded structures, methods of and apparatus for producing the molded structures. At least a portion of the surface features for the molds are formed from multilayer electrochemically fabricated structures (e.g. fabricated by the EFAB ™ formation process), and typically contain features having resolutions within the 1 to 100 µm range. The layered structure is combined with other mold components, as necessary, and a molding material is injected into the mold and hardened. The layered structure is removed (e.g. by etching) along with any other mold components to yield the molded article. In some embodiments portions of the layered structure remain in the molded article and in other embodiments an additional molding material is added after a partial or complete removal of the layered structure. |
| U.S. application Ser. No. 60/379,177 May 7, 2002 | Electrochemically Fabricated Structures Having Dielectric Bases and Methods of and Apparatus for Producing Such Structures Describes multilayer structures that are electrochemically fabricated (e.g. by EFAB ™) on a temporary conductive substrate and are thereafter are bonded to a permanent dielectric substrate and removed from the temporary substrate. The structures are formed from top layer to bottom layer, such that the bottom layer of the structure becomes adhered to the permanent substrate. The permanent substrate may be a solid sheet that is bonded (e.g. by an adhesive) to the layered structure or the permanent substrate may be a flowable material that is solidified adjacent to or partially surrounding a portion of the structure with bonding occurs during solidification. The multilayer structure may be released from a sacrificial material prior to attaching the permanent substrate or more preferably it may be released after attachment. |
| U.S. application Ser. No. 60/379,182 May 7, 2002 | Electrochemically Fabricated Hermetically Sealed Microstructures and Methods of and Apparatus for Producing Such Structures Describes multilayer structures that are electrochemically fabricated (e.g. by EFAB ™) from at least one structural material (e.g. nickel), at least one sacrificial material (e.g. copper), and at least one sealing material (e.g. solder). The layered structure is made to have a desired configuration which is at least partially and immediately surrounded by sacrificial material which is in turn surrounded almost entirely by structural material. The surrounding structural material includes openings in the surface through which etchant can attack and remove trapped sacrificial material found within. Sealing material is located near the openings. After removal of the sacrificial material, the box is evacuated or filled with a desired gas or liquid. Thereafter, the sealing material is made to flow, seal the openings, and resolidify. |
| U.S. application Ser. No. 60/379,184 May 7, 2002 | Multistep Release Method for Electrochemically Fabricated Structures Describes multilayer structures that are electrochemically fabricated (e.g. by EFAB ™) from at least one structural material (e.g. nickel), that is configured to define a desired structure and which may be attached to a support structure, and at least a first sacrificial material (e.g. copper) that surrounds the desired structure, and at least one more material which surrounds the |

-continued

| U.S. application Ser. No.<br>Filing Date | Title<br>Brief Description |
| --- | --- |
| | first sacrificial material and which will function as a second sacrificial material. The second sacrificial material is removed by an etchant and/or process that does not attack the first sacrificial material. Intermediate post processing activities may occur, and then the first sacrificial material is removed by an etchant or process that does not attack the at least one structural material to complete the release of the desired structure. |
| U.S. application Ser. No. 60/392531<br>Jun. 27, 2002 | Miniature RF and Microwave Components and Methods for Fabricating Such Components<br>RF and microwave radiation directing or controlling components describes that are monolithic, that are formed from a plurality of electrodeposition operations, that are formed from a plurality of deposited layers of material, that include inductive and capacitive stubs or spokes that short a central conductor of a coaxial component to the an outer conductor of the component, that include non-radiation-entry and non-radiation-exit channels that are useful in separating sacrificial materials from structural materials and that are useful, and/or that include surface ripples on the inside surfaces of some radiation flow passages. Preferred formation processes use electrochemical fabrication techniques (e.g. including selective depositions, bulk depositions, etching operations and planarization operations) and post-deposition processes (e.g. selective etching operations and/or back filling operations). |
| U.S. application Ser. No. TBD<br>Dkt No. P-US018-B-MG<br>Oct. 1, 2002 | Multi-cell Masks and Method and Apparatus for Using Such Masks<br>To Form Three-Dimensional Structures<br>Describes multilayer structures that are electrochemically fabricated via depositions of one or more materials in a plurality of overlaying and adhered layers. Selectivity of deposition is obtained via a multi-cell controllable mask. Alternatively, net selective deposition is obtained via a blanket deposition and a selective removal of material via a multi-cell mask. Individual cells of the mask may contain electrodes comprising depositable material or electrodes capable of receiving etched material from a substrate. Alternatively, individual cells may include passages that allow or inhibit ion flow between a substrate and an external electrode and that include electrodes or other control elements that can be used to selectively allow or inhibit ion flow and thus inhibit significant deposition or etching. |
| U.S. application Ser. No. TBD<br>Dkt No. P-US025-A-MG<br>Oct. 1, 2002 | Monolithic Structures Including Alignment and/or Retention Fixtures<br>for Accepting Components<br>Describes permanent or temporary alignment and/or retention structures for receiving multiple components. The structures are preferably formed monolithically via a plurality of deposition operations (e.g. electrodeposition operations). The structures typically include two or more positioning fixtures that control or aid in the positioning of components relative to one another, such features may include (1) positioning guides or stops that fix or at least partially limit the positioning of components in one or more orientations or directions, (2) retention elements that hold positioned components in desired orientations or locations, and (3) positioning and/or retention elements that receive and hold adjustment modules into which components can be fixed and which in turn can be used for fine adjustments of position and/or orientation of the components. |

Various other embodiments of the present invention exist. Some of these embodiments may be based on a combination of the teachings herein with various teachings incorporated herein by reference. Some embodiments may not use any blanket deposition process and/or they may not use a planarization process. Some embodiments may involve the selective deposition of a plurality of different materials on a single layer or on different layers. Some embodiments may use blanket depositions processes that are not electrodeposition processes. Some embodiments may use selective deposition processes on some layers that are not conformable contact masking processes and are not even electrodeposition processes. Some embodiments may use nickel as a structural material while other embodiments may use different materials such as gold, silver, or any other electrodepositable materials that can be separated from copper and/or some other sacrificial material. Some embodiments may use copper as the structural material with or without a sacrificial material. Some embodiments may remove a sacrificial material while other embodiments may not. Some embodiments may use multiple conformable contact masks with different patterns so as to deposit different selective patterns of material on different layers and/or on different portions of a single layer.

In view of the teachings herein, many further embodiments, alternatives in design and uses of the instant invention will be apparent to those of skill in the art. As such, it is not intended that the invention be limited to the particular illustrative embodiments, alternatives, and uses described above but instead that it be solely limited by the claims presented hereafter.

The invention claimed is:

1. A method of producing a structure, comprising:
providing an electrode that functions as an anode;
providing a substrate that functions as a cathode;
providing an electrolyte between the anode and the cathode;
providing a current source controllably connected to the anode and cathode;
providing a mask that comprises an at least partially conformable material, the mask having at least one opening extending through the conformable material wherein the opening is defined by mask sidewalls and wherein the opening defines a mask pattern, the conformable portion of the mask also having a face surface;
pressing the face surface of the mask against the substrate;
after pressing, activating the current source to cause deposition of a material onto the substrate in a deposition pattern that is at least in part dictated by the pattern of the mask, wherein the deposition comprises deposition sidewalls;
after said activating, relatively moving the face surface of the mask away from the substrate by a distance that is less than a distance that would cause separation of the mask sidewalls from the deposition sidewalls, and continuing application of the current so as to allow a height of the deposition to increase to produce the structure; and
deviating a shape of the deposition such that the deposition has tapering sidewalls,
wherein the deviating of the shape of the deposition occurs prior to completing the depositing that results in a full height of the deposition;
wherein the deviating of the shape occurs by varying the dimensions over time of the at least one opening defined by the mask sidewalls.

2. The method of claim 1 wherein the deviating is at least in part accomplished by varying the temperature of at least a portion of the conformable portion of the mask.

3. The method claim 1 wherein the tapering provides a deposition that is larger near the substrate and smaller away from the substrate.

4. A method of producing a structure, comprising:
providing an anode;
providing a substrate that functions as a cathode;
providing an electrolyte between the anode and the cathode;
providing a current source controllably connected to the anode and cathode;
providing a mask that comprises an at least partially conformable material, the mask having at least one opening extending through the conformable material wherein the opening is defined by mask sidewalls and wherein the opening defines a mask pattern, the conformable portion of the mask also having a face surface;
pressing the face surface of the mask against the substrate;
after pressing, activating the current source to cause deposition of a material onto the substrate in a deposition pattern that is at least in part dictated by the pattern of the mask, wherein the deposition comprises deposition sidewalls;
after said activating, relatively moving the face surface of the mask away from the substrate by a distance that is less than a distance that would cause separation of the mask sidewalls from the deposition sidewalls, and continuing application of the current so as to allow a height of the deposition to increase to produce the structure; and
after an initial separating of the mask and the substrate, locating a liquid within a region between the mask and substrate such that any residual electrolyte that remains or leaks between the sidewalls of the mask and the sidewalls of the deposition is diluted or removed such that deposition onto the substrate within the region is eliminated or at least held to a tolerable level.

5. The method of claim 4 wherein the liquid within the region is agitated.

6. The method of claim 4 wherein the liquid within the region is made to flow.

7. A method of producing a structure, comprising:
providing an anode;
providing a substrate that functions as a cathode;
providing an electrolyte between the anode and the cathode;
providing a current source controllably connected to the anode and cathode;
providing a mask that comprises an at least partially conformable material, the mask having at least one opening extending through the conformable material wherein the opening is defined by mask sidewalls and wherein the opening defines a mask pattern, the conformable portion of the mask also having a face surface;
pressing the face surface of the mask against the substrate;
after pressing, activating the current source to cause deposition of a first material onto the substrate in a deposition pattern that is at least in part dictated by the pattern of the mask, wherein the deposition comprises deposition sidewalls;
after said activating, relatively moving the face surface of the mask away from the substrate by a distance that is less than a distance that would cause separation of the mask sidewalls from the deposition sidewalls, and continuing application of the current so as to allow a height of the deposition to increase; and
after an initial separating of the mask and the substrate, depositing a second material onto the substrate around the deposited first material during a period selected from the group of (1) simultaneously with deposition of the first material or (2) alternating with depositions of the first material;
wherein the structure comprises both the first material and the second material.

8. The method of claim 7 wherein the first material comprises copper and the second material comprises nickel.

9. The method of claim 8 wherein the deposited copper and nickel are planarized to have similar heights.

10. A method of producing a structure, comprising:
providing an electrode that functions as an anode;
providing a substrate that functions as a cathode;
providing an electrolyte between the anode and the cathode;
providing a current source controllably connected to the anode and cathode;
providing a mask that comprises an at least partially conformable material, the mask having at least one opening extending through the conformable material wherein the opening is defined by mask sidewalls and wherein the opening defines a mask pattern, the conformable portion of the mask also having a face surface;

pressing the face surface of the mask against the substrate;

after pressing, activating the current source to cause deposition of a material onto the substrate in a deposition pattern that is at least in part dictated by the pattern of the mask, wherein the deposition comprises deposition sidewalls; and after said activating, relatively moving the face surface of the mask away from the substrate by a distance that is less than a distance that would cause separation of the mask sidewalls from the deposition sidewalls, and continuing application of the current so as to allow a height of the deposition to increase;

interrupting the application of the current that increases the deposition height; and etching a portion of the material from the substrate during the interruption and then continuing application of a current that increases the deposition height to produce the structure.

11. The method of claim 10 wherein the etching is initiated by applying an anodic potential to the substrate and conducting a current between the substrate and a cathode.

12. The method of claim 10 wherein depositing and etching are alternated a plurality of times.

13. A method of producing a structure, comprising:
providing an electrode that functions as an anode;
providing a substrate that functions as a cathode;
providing an electrolyte between the anode and the cathode;
providing a current source controllably connected to the anode and cathode;
providing a mask that comprises an at least partially conformable material, the mask having at least one opening extending through the conformable material wherein the opening is defined by mask sidewalls and wherein the opening defines a mask pattern, the conformable portion of the mask also having a face surface;

pressing the face surface of the mask against the substrate;

after pressing, activating the current source to cause deposition of a material onto the substrate in a deposition pattern that is at least in part dictated by the pattern of the mask, wherein the deposition comprises deposition sidewalls; and after said activating, relatively moving the face surface of the mask away from the substrate by a distance that is less than a distance that would cause separation of the mask sidewalls from the deposition sidewalls, and continuing application of the current so as to allow a height of the deposition to increase to produce the structure;

wherein the mask further comprises a support structure which is adhered to the conformable material and through which the at least one opening extends, wherein a cross-sectional dimension of at least one opening through at least a portion of the support structure is smaller than a cross-sectional dimension of the opening through the conformable material; and wherein a height of deposition, relative to the support structure, within the at least one opening, is, at least in part, ascertained by detecting a change of an electrical property.

14. The method of claim 13 wherein the electric property comprises a change in voltage between the anode and cathode.

15. A method of producing a structure, comprising:
providing an electrode that functions as an anode;
providing a substrate that functions as a cathode;
providing an electrolyte between the anode and the cathode;
providing a current source controllably connected to the anode and cathode;
providing a mask that comprises an at least partially conformable material, the mask having at least one opening extending through the conformable material wherein the opening is defined by mask sidewalls and wherein the opening defines a mask pattern, the conformable portion of the mask also having a face surface;

pressing the face surface of the mask against the substrate;

after pressing, activating the current source to cause deposition of a material onto the substrate in a deposition pattern that is at least in part dictated by the pattern of the mask, wherein the deposition comprises deposition sidewalls; and after said activating, relatively moving the face surface of the mask away from the substrate by a distance that is less than a distance that would cause separation of the mask sidewalls from the deposition sidewalls, and continuing application of the current so as to allow a height of the deposition to increase to produce the structure; and detecting a first electrical parameter whose value depends on a location of a deposit within the opening.

16. The method of claim 15 additionally comprising detecting a second electrical parameter whose value depends on a location of a deposit within the opening.

17. The method of claim 16 wherein the first electrical parameter indicates whether or not the deposit extends too deep into the opening and the second electrical parameter indicates whether or not the deposit extends at least a minimum acceptable depth into the opening.

18. The method of claim 15 wherein the first electrical parameter comprises a voltage difference between the substrate and a conductor positioned at a first level of an opening in the mask.

19. The method of claim 15 wherein the first electrical parameter comprises a voltage difference between the anode and a conductor positioned at a first level of an opening in the mask.

20. The method of claim 15 wherein detection of selected values of the electrical parameter influence movement between the mask and the substrate.

* * * * *